US006983790B2

(12) United States Patent  
Ippoushi et al.

(10) Patent No.: US 6,983,790 B2
(45) Date of Patent: Jan. 10, 2006

(54) HEAT TRANSPORT DEVICE, SEMICONDUCTOR APPARATUS USING THE HEAT TRANSPORT DEVICE AND EXTRA-ATMOSPHERIC MOBILE UNIT USING THE HEAT TRANSPORT DEVICE

(75) Inventors: Shigetoshi Ippoushi, Tokyo (JP); Tetsuro Ogushi, Tokyo (JP); Kazushige Nakao, Tokyo (JP); Hiroaki Ishikawa, Tokyo (JP); Toshiyuki Umemoto, Tokyo (JP); Hiroshi Chiba, Tokyo (JP); Mihoko Shimoji, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 82 days.

(21) Appl. No.: 10/618,657

(22) Filed: Jul. 15, 2003

(65) Prior Publication Data

US 2005/0072559 A1  Apr. 7, 2005

Related U.S. Application Data

(63) Continuation-in-part of application No. 10/400,190, filed on Mar. 27, 2003, now abandoned.

(51) Int. Cl.
*F28D 15/00* (2006.01)
(52) U.S. Cl. .................... 165/104.22; 165/104.33; 165/104.13; 361/700; 257/715; 174/15.2
(58) Field of Classification Search .......... 165/104.26, 165/104.25, 104.28, 104.33, 185, 80.4; 361/700; 174/15.2; 257/714–716
See application file for complete search history.

(56) References Cited

U.S. PATENT DOCUMENTS

| 3,517,730 | A | * | 6/1970 | Wyatt .......................... 165/272 |
| 3,605,878 | A | * | 9/1971 | Coleman ...................... 165/272 |
| 4,106,554 | A | * | 8/1978 | Arcella ......................... 165/272 |
| 4,137,964 | A | * | 2/1979 | Buckley ....................... 165/287 |
| 4,423,768 | A | * | 1/1984 | Edelman et al. .............. 165/84 |
| 4,986,348 | A | * | 1/1991 | Okayasu ................. 165/104.24 |
| 5,746,064 | A | * | 5/1998 | Tsenter ......................... 62/480 |

(Continued)

FOREIGN PATENT DOCUMENTS

| JP | 61-195284 | 8/1986 |
| JP | 64-32699 | 2/1989 |
| JP | 5-283571 | 10/1993 |
| JP | 6-120384 | * 4/1994 |

(Continued)

*Primary Examiner*—Terrell McKinnon
(74) *Attorney, Agent, or Firm*—Leydig, Voit & Mayer, Ltd.

(57) ABSTRACT

A heat transport device includes a container having a hollow structure including a fluid channel, at least one thermal-receiver heat exchanger and one thermal-radiator heat exchanger arranged side-by-side on an outer wall of the container along the fluid channel, and driving heat exchangers at respective terminal portions of the container. In this heat transport device, both ends of the fluid channel are closed to prevent intrusion of external air, and a liquid and a gas are sealed in the fluid channel. The driving heat exchangers cause the liquid to oscillate in the container along the internal fluid channel. The heat transport device provides low acoustic noise performance, improved temperature controllability, high heat transportation and heat radiating capacities, and improved heat transfer and fluid flow characteristics.

19 Claims, 22 Drawing Sheets

U.S. PATENT DOCUMENTS

| | | | |
|---|---|---|---|
| 6,167,955 B1 * | 1/2001 | Van Brocklin et al. | 165/272 |
| 6,247,525 B1 * | 6/2001 | Smith et al. | 165/104.25 |
| 6,425,440 B1 * | 7/2002 | Tsenter et al. | 165/104.12 |
| 6,435,274 B1 * | 8/2002 | Weislogel | 165/274 |
| 6,684,941 B1 * | 2/2004 | Cao et al. | 165/104.25 |

FOREIGN PATENT DOCUMENTS

| | | | |
|---|---|---|---|
| JP | 7-127981 | | 5/1995 |
| JP | 7-286788 | * | 10/1995 |
| JP | 6-266474 | * | 9/1997 |

* cited by examiner

FIG. 13A
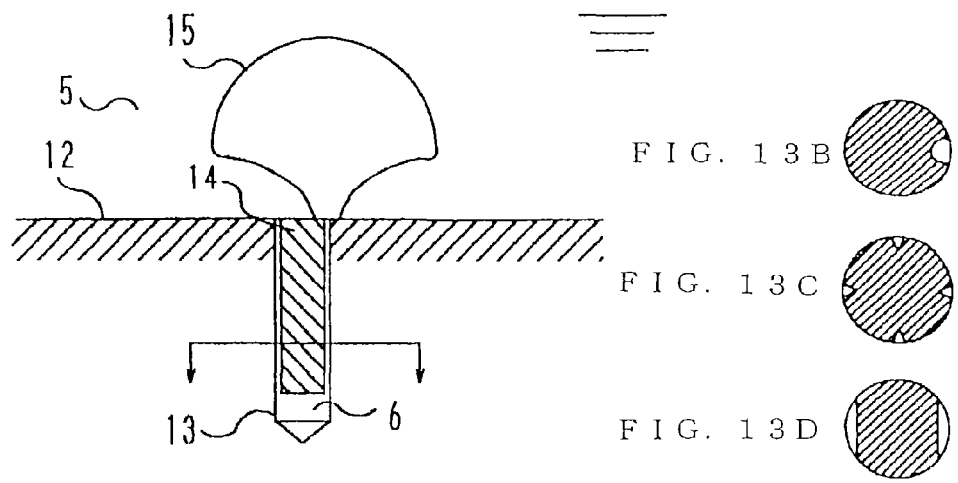
FIG. 13B
FIG. 13C
FIG. 13D
FIG. 14A
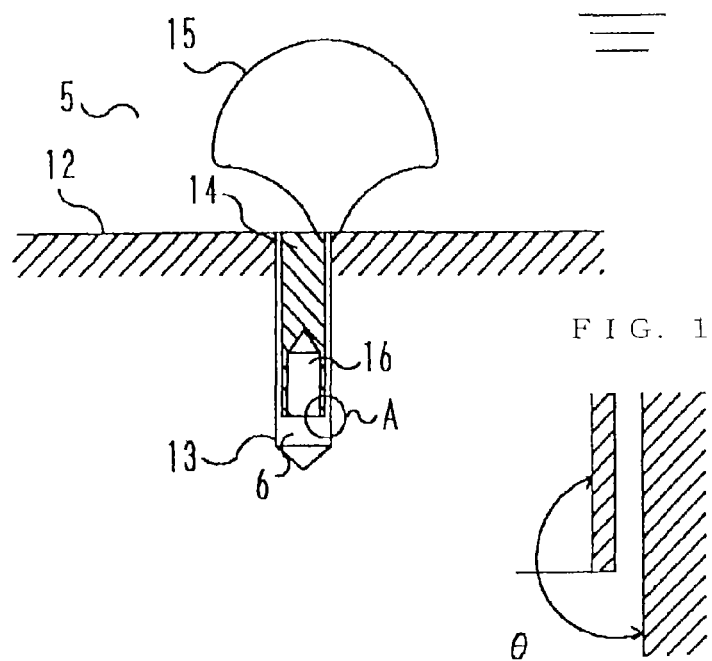
FIG. 14B

HEAT TRANSPORT DEVICE, SEMICONDUCTOR APPARATUS USING THE HEAT TRANSPORT DEVICE AND EXTRA-ATMOSPHERIC MOBILE UNIT USING THE HEAT TRANSPORT DEVICE

CROSS-REFERENCES TO RELATED APPLICATIONS

This application is a continuation-in-part of U.S. patent application Ser. No. 10/400,190 filed Mar. 27, 2003, now abandoned.

BACKGROUND OF THE INVENTION

1. Field of the Invention

The present invention relates to a heat transport device used for cooling electronics equipment, for example.

2. Description of the Background Art

To meet requirements for reliability, lightweight design, and low acoustic noise performance, a heat pipe having no moving parts, unlike pumps, has conventionally been used as a heat transport device for cooling electronics equipment, for example. It has however become difficult in recent years to cool electronic and other types of equipment by using heat pipes as a result of a rapid increase in the amount of heat radiated from the equipment.

In addition, as it is fairly difficult to control the temperature with a heat pipe, there has been a pending need for a heat transport device which allows easy temperature control.

Under these circumstances, new heat transport devices have recently been developed taking into consideration low acoustic noise performance and good temperature controllability.

One of such conventional heat transport devices is disclosed in Japanese Laid-open Patent Publication No. H7-286788, in which a pair of flat headers are interconnected by small-diameter tubes and a liquid is sealed inside the heat transport device, leaving a gas phase portion at one end of a fluid channel. The fluid channel is formed of fins provided inside the headers, and a capillary tube equipped with a heating unit, such as an electric heater, is connected to a particular part of one header. In this heat transport device, a power source supplies a voltage of a pulse-shaped waveform to the heating unit to heat the liquid inside the capillary tube in a steplike fashion, eventually causing the liquid to bump. This produces the effect of a so-called bubble lift pump, like the one shown in FIG. 1 appended to the aforementioned Japanese Laid-open Patent Publication No. H7-286788. In that device, the liquid is driven by a rapid pressure increase as a result of evaporation at one end of the fluid channel, while volumetric changes are absorbed by the gas phase portion at the other end of the fluid channel.

The aforementioned conventional heat transport device has a problem that its heat transportation and heat radiating capacities are low. This is because the conventional heat transport device is of a type which dissipates heat by driving the liquid as a result of a small-scale oscillation of the liquid within a capillary tube by means of a bubble lift pump.

Although the liquid used as a working fluid should preferably have properties suited to a bubble lift pump as well as good heat transfer and flow characteristics, it has so far been extremely difficult to satisfy all these requirements. In other words, there has been a problem that it is difficult to increase the amplitude of oscillation and reduce the period of oscillation of the working fluid for improving the performance of the bubble lift pump and to improve the heat transfer and flow characteristics of the working fluid.

SUMMARY OF THE INVENTION

The present invention is intended to overcome the aforementioned problems of the prior art. Accordingly, it is an object of the invention to provide a heat transport device featuring low acoustic noise performance and improved temperature controllability as well as high heat transportation and heat radiating capacities. It is another object of the invention to provide a heat transport device capable of offering improved performance as a bubble lift pump. It is a further object of the invention to provide a heat transport device using a working fluid having improved heat transfer and flow characteristics.

According to the invention, a heat transport device includes a container having a hollow structure in which a fluid channel is formed, at least one each thermal-receiver-type heat exchanger and thermal-radiator-type heat exchanger arranged on an outer wall of the container along the fluid channel, and driving heat exchangers provided at both terminal portions of the container. In this heat transport device, both ends of the fluid channel are closed to prevent intrusion of external air, and a liquid and gas are sealed in the fluid channel. The driving heat exchangers cause the liquid to oscillate in the container along its fluid channel.

Since the driving heat exchangers provided at both terminal portions of the container cause the liquid to oscillate along the fluid channel, the heat transport device offers low acoustic noise performance and improved temperature controllability as well as an enhanced heat transport efficiency.

These and other objects, features and advantages of the invention will become more apparent upon reading the following detailed description along with the accompanying drawings.

BRIEF DESCRIPTION OF THE DRAWINGS

FIGS. 13A–13D are fragmentary sectional diagrams showing the construction of a heat transport device according to a ninth embodiment of the invention;

FIGS. 14A–14B are fragmentary sectional diagrams showing the construction of a heat transport device according to a tenth embodiment of the invention;

DESCRIPTION OF THE PREFERRED EMBODIMENTS

Specific embodiments of the invention are now described with reference to the appended drawings.

First Embodiment

Figure 1A:
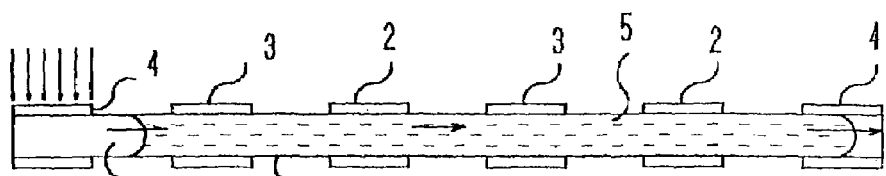
FIGS. 1A–1B are sectional diagrams showing the construction of a heat transport device according to a first embodiment of the invention.
Figure 1B:
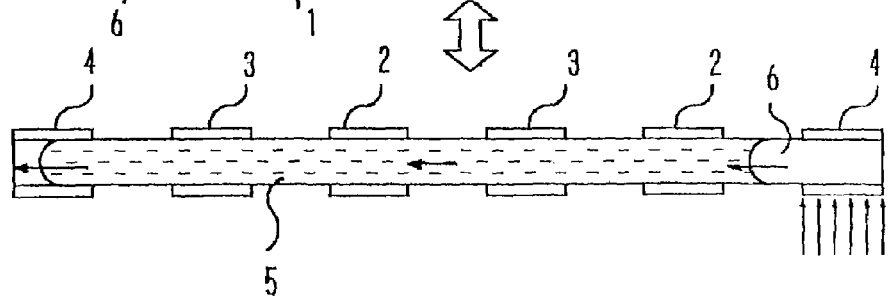

FIGS. 1A–1B are sectional diagrams showing the construction of a heat transport device according to a first embodiment of the invention, in which the numeral 1 designates a container. The container 1 is not particularly limited in its physical size. It may be formed of a microtube, for example, in which case, the invention can be applied to a microstructure such as a semiconductor apparatus.

As shown in FIGS. 1A–1B, appropriate quantities of a liquid 5 and a gas 6 are sealed in the container 1 and one each or more thermal-receiver-type heat exchangers 2 and thermal-radiator-type heat exchangers 3 are alternately arranged side by side on an outer wall of the container 1 along its length, with driving heat exchangers 4 provided at both terminal portions of the container 1.

The interior of the container 1 forms a fluid channel in which the liquid 5 and the gas 6 move. The thermal-receiver-type heat exchangers 2 are heat generating portions of an electronic apparatus or a semiconductor device, or heat radiating portions thereof for releasing heat of the heat generating portions, for example. The thermal-radiator-type heat exchangers 3 are heat receiving portions of external heat transport means or its heat radiating walls which release heat by natural or forced convection, heat conduction or radiation. The thermal-radiator-type heat exchangers 3 may be formed of portions of the container 1 exposed directly to the exterior (e.g., surrounding atmosphere, water or outer space) such that heat is directly dissipated by natural or forced convection or radiation. In this case, fins or the like may be fitted to the exposed portions of the surface of the container 1.

The driving heat exchangers 4 may be heat exchangers like electric heaters which are provided at both terminal portions of the container 1 and can be heated periodically or such a heat source as sunlight of which amount of input heat varies with time. In a case where the heat transport device is installed on an apparatus like an artificial satellite orbiting the earth, for example, the heat transport device is cyclically heated and cooled at particular intervals. More specifically, a surface of the heat transport device upon which sunlight is incident is heated, while the opposite surface is cooled. Regularly recurring heating and cooling cycles of this kind may be used as the driving heat exchangers 4.

The liquid 5 may be a liquid of a single substance, such as distilled water, ethyl alcohol or ammonia, or a mixture of two or more such single-substance liquids. In any case, the liquid 5 is a liquid which can undergo phase changes, that is, a working fluid in which liquid phase and vapor phase coexist. The gas 6 is a vapor of the liquid 5, although the gas 6 may contain a small amount of gas other than the vapor of the liquid 5.

In the heat transport device constructed as shown in FIGS. 1A–1B, portions of the liquid 5 in the container 1 close to the thermal-receiver-type heat exchangers 2 receive heat and become warmer, producing high-temperature liquid masses, whereas portions of the liquid 5 in the container 1 close to the thermal-radiator-type heat exchangers 3 release heat and become cooler, producing low-temperature liquid masses. Let us assume that the left-hand driving heat exchanger 4 is heated, or once heated and then cooled, as shown in FIG. 1A, and after a specific period of time has passed, the right-hand driving heat exchanger 4 is heated, or once heated and then cooled, as shown in FIG. 1B, where the duration to complete this alternate heating sequence is referred to as one cycle or period. If the two terminal portions of the container 1 are alternately heated by the respective driving heat exchangers 4 in this fashion, vapor develops due to boiling, builds up due to continued boiling or evaporation, and shrinks due to condensation at the left and right ends of the interior of the container 1 with a time delay equal to a half-cycle duration, causing the high-temperature and low-temperature liquid masses formed in a middle part of the container 1 to move left and right as if in an oscillating motion. As a result of this oscillating motion, the high-temperature liquid masses move to the locations of the individual thermal-radiator-type heat exchangers 3, where heat of the high-temperature liquid masses is released, producing low-temperature liquid masses. On the other hand, the low-temperature liquid masses move to the locations of the individual thermal-receiver-type heat exchangers 2, where the liquid masses receive heat and turn into high-temperature liquid masses.

As discussed above, the heat transport device of the present embodiment is constructed in such a manner that the left and right ends of the container 1 are alternately heated at regular intervals by the driving heat exchangers 4 provided at both terminal portions of the container 1. As a result, the liquid 5 is caused to periodically oscillate left and right to and from the locations of the thermal-receiver-type heat exchangers 2 and the thermal-radiator-type heat exchangers 3, whereby the heat transport device works as a bubble lift pump featuring improved performance characteristics. Since heat is transported from the thermal-receiver-type heat exchangers 2 to the thermal-radiator-type heat exchangers 3 in this fashion, it is possible to easily increase the amplitude of oscillation and reduce the period of oscillation of the liquid 5 by varying the amount of heat input and the interval of heating cycles. This makes it possible to improve heat transport efficiency and control the temperature of the liquid 5 at the locations of the individual thermal-receiver-type heat exchangers 2.

Since the heat transport device of this embodiment has no moving parts unlike a pump, it provides enhanced durability and reliability and can be made compact and lightweight.

Furthermore, unlike a heat pipe which utilizes gravity, the heat transport device of the embodiment does not use gravity and is not easily affected by the effect of gravity due to its construction. Therefore, the heat transport device can be used in the microgravity or zero-gravity environment of space as well as under high-gravity conditions.

Second Embodiment

In the heat transport device of FIGS. 1A–1B, it is preferable that the internal volume V1 of a portion of the container 1 where each driving heat exchanger 4 is provided be equal to or larger than the internal volume V2 of that portion of the container 1 which is bounded by the center of each thermal-receiver-type heat exchanger 2 and the center of its adjacent thermal-radiator-type heat exchanger 3. It is also preferable that the total volume V3 of the liquid 5 be approximately equal to a value obtained by subtracting the volume V1 from the total internal volume V of the container 1.

If the heat transport device is designed such that the internal volumes V1, V2 and the volume V3 satisfy the relationships $V1 \geq V2$ and $V3 \approx V - V1$, the liquid 5 can be caused to oscillate with a large amplitude. When a larger oscillation of the liquid 5 is produced in this fashion, masses of the liquid 5 move between multiple pairs of the thermal-receiver-type heat exchangers 2 and the thermal-radiator-type heat exchangers 3, so that heat is transported from the thermal-receiver-type heat exchangers 2 to the thermal-radiator-type heat exchangers 3 with a higher efficiency.

Third Embodiment

Figure 2:
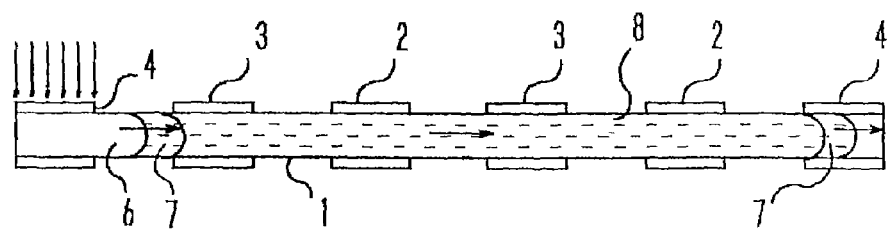
FIG. 2 is a sectional diagram showing the construction of a heat transport device according to a third embodiment of the invention.

FIG. 2 is a sectional diagram showing the construction of a heat transport device according to a third embodiment of the invention, in which elements identical or similar to those depicted in FIGS. 1A–1B are designated by the same reference numerals. What is characteristic of the third embodiment is that it employs a combination of a low-boiling liquid 7 and a high-boiling liquid 8 which do not mix and remain separated from each other.

The low-boiling liquid 7 should be a liquid which shows a large volumetric change with a small amount of heat input. For example, a liquid having a small amount of latent heat and a large difference in density between the liquid and vapor phases is sealed in both terminal portions of a container 1 where the liquid is held in contact with driving heat exchangers 4. On the other hand, the high-boiling liquid 8 should be a liquid which has a higher boiling point than the low-boiling liquid 7, high fluidity and good heat transportation performance. For example, a liquid having a small viscosity coefficient, a large heat capacity and a high thermal conductivity is sealed between masses of the low-boiling liquid 7 at both terminal portions of the container 1. Specifically, Fluorinert (which is a trademark of a product of Sumitomo 3M Ltd. expressed by the chemical formula $C_6F_{14}$) or Freon HFC134a may be used as the low-boiling liquid 7 while water which does not mix with the low-boiling liquid 7 may be used as the high-boiling liquid 8, for example.

By using the combination of the low-boiling liquid 7 and the high-boiling liquid 8 separated from each other, it is possible to produce a large oscillation of the high-boiling liquid 8 with a small amount of energy consumption by the driving heat exchangers 4 (resulting in a high coefficient of performance) and reduce the period of oscillation.

Even if the amount of heat input through the thermal-receiver-type heat exchangers 2 is large and the temperature of liquid masses close to the thermal-receiver-type heat exchangers 2 increases, vapor develops, builds up and condenses in a stable manner at the locations of the driving heat exchangers 4, because the low-boiling liquid 7 is present at both terminal portions of the container 1. Consequently, it is possible to cause the high-boiling liquid 8 to oscillate and transport heat in a stable manner. Accordingly, the present embodiment helps increase the amount of maximum transportable heat.

Fourth Embodiment

While the invention has been described with reference to the examples in which the container 1 has a uniform thickness from one end to the other in the foregoing embodiments, the invention is not limited to this construction.

Figure 3A:
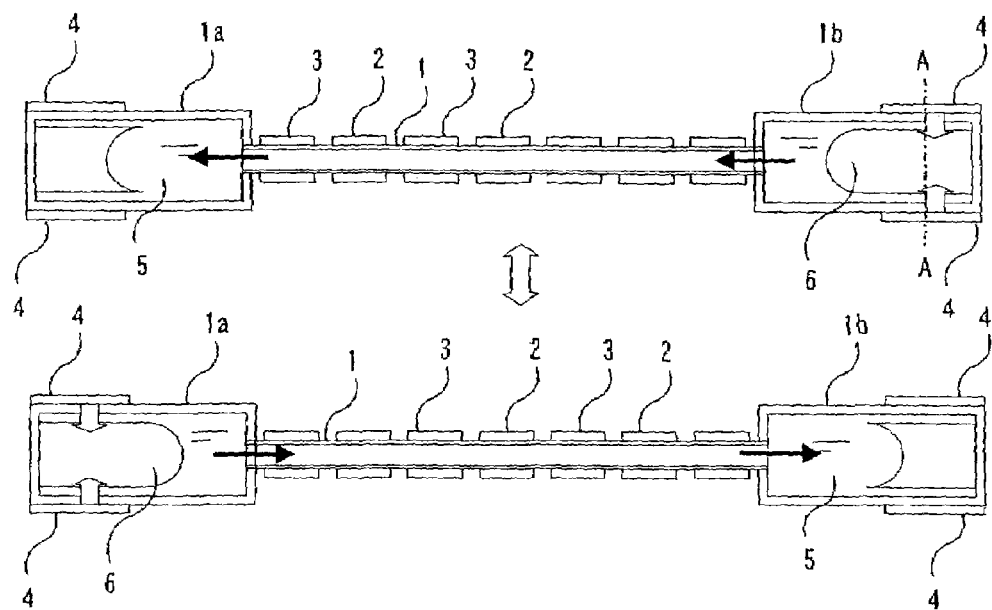
FIGS. 3A–3B are sectional diagrams showing the construction of a heat transport device according to a fourth embodiment of the invention.
Figure 3B:
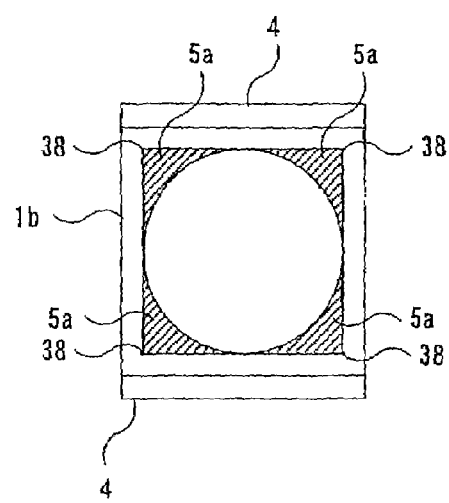

FIGS. 3A–3B show a heat transport device according to a fourth embodiment of the invention, in which elements identical or similar to those depicted in FIGS. 1A–1B are designated by the same reference numerals and their description is omitted here. In this embodiment, there are provided liquid reservoirs 1a, 1b at both ends of a container 1 as shown in FIG. 3A. The liquid reservoirs 1a, 1b at both terminal portions of the container 1 have a larger cross section than the other portion (central portion) of the container 1 so that the total volume of a liquid 5 sealed in the container 1 is larger than that sealed in the containers 1 of the foregoing embodiments.

As shown in FIG. 3B which is an enlarged cross section taken along a line A—A of FIG. 3A, the two liquid reservoirs 1a, 1b have the same rectangular shape, each forming four internal corners 38 in cross section. Since the liquid 5 is held along these corners 38 due to a capillary action, there are formed liquid fillets 5a along the internal corners 38 inside the liquid reservoirs 1a, 1b.

In the heat transport device of the fourth embodiment constructed as described above, the liquid 5 acts in a manner similar to the foregoing embodiments. Since the container 1 of this embodiment has the liquid reservoirs 1a, 1b, however, it is possible to increase the total volume of the liquid 5 and thereby increase the length of travel of the liquid 5 caused by its oscillating motion. In addition, because the container 1 has the rectangular-shaped liquid reservoirs 1a, 1b having the internal corners 38, there are formed the liquid fillets 5a along the internal corners 38.

According to this construction, it is not necessary for driving heat exchangers 4 to heat the entirety of the liquid 5 in the liquid reservoirs 1a, 1b to cause phase changes therein. Rather, the driving heat exchangers 4 can convert (or evaporate) the liquid 5 into a gas 6 by heating only the liquid fillets 5a, so that the embodiment allows effective use of heat generated by the driving heat exchangers 4. Furthermore, because the liquid 5 held in the liquid reservoirs 1a, 1b is continuously supplied to the liquid fillets 5a, it is possible to increase the amount of evaporation (gas 6) according to the amount of heat input from the driving heat exchangers 4.

Although the liquid reservoirs 1a, 1b are rectangular-shaped in cross section in the fourth embodiment described above, the shape of the liquid reservoirs 1a, 1b is not limited thereto. The liquid reservoirs 1a, 1b may be of any desired shape (e.g., triangle, polygon, or sector form) as long as one or more corners are formed in cross section. Liquid fillets are formed along such corners and it is needless to say that they exert the same advantageous effect as mentioned above.

Fifth Embodiment

While the invention has been described with reference to the examples in which the driving heat exchangers 4 are formed by heating units and both heating and cooling cycles of the heat transport device are performed by heating operation of the driving heat exchangers 4 in the foregoing embodiments, the invention is not limited to this construction. In one alternative, the heat transport device may be provided with cooling units serving as additional driving heat exchangers. Described below is an example provided with such driving heat exchangers serving as cooling units in addition to the driving heat exchangers serving as heating units.

Figure 4A:
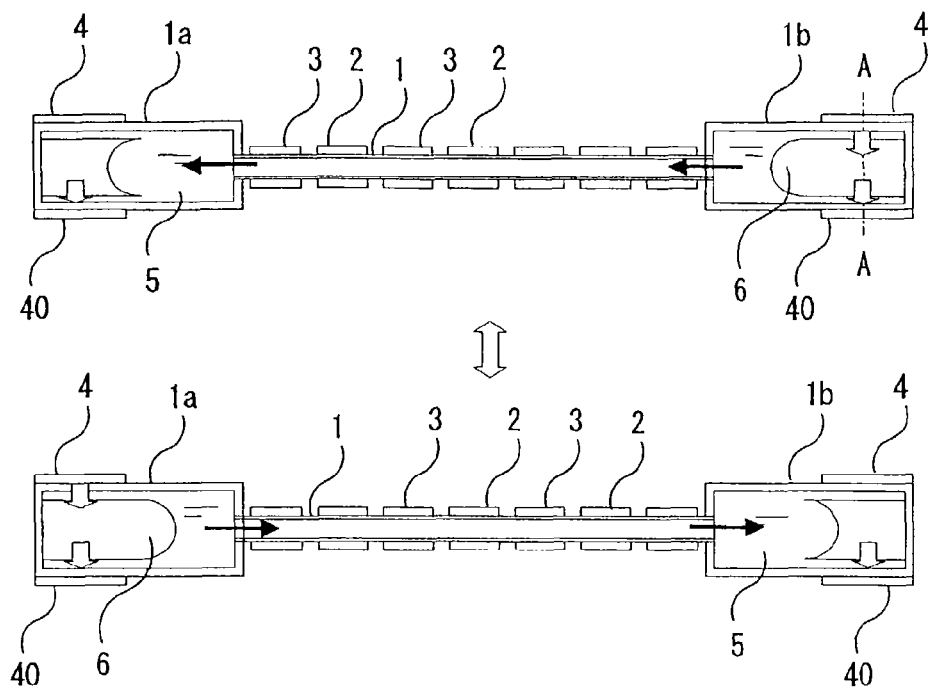
FIGS. 4A–4B are sectional diagrams showing the construction of a heat transport device according to a fifth embodiment of the invention.
Figure 4B:
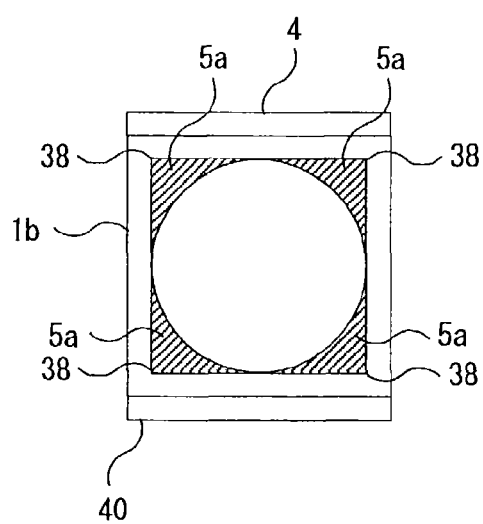

FIGS. 4A–4B are sectional diagrams showing the construction of a heat transport device according to a fifth embodiment of the invention, in which FIG. 4B is an enlarged cross section taken along a line A—A of FIG. 4A. In these Figures, elements identical or similar to those depicted in the foregoing embodiments are designated by the same reference numerals and their description is omitted here. The heat transport device of this embodiment is provided with cooling units 40 serving as driving heat exchangers in addition to driving heat exchangers 4 serving as heating units at both ends of a container 1.

Operation of the heat transport device of the fifth embodiment constructed as shown in FIGS. 4A–4B is now described. While a liquid reservoir 1a at one end of the container 1 is heated by the driving heat exchanger 4 for a particular period of time, the cooling unit 40 provided at the same liquid reservoir 1a is not operated (or does not cool the liquid reservoir 1a). During this time period, the driving heat exchanger 4 provided at the other end of the container 1 is not operated (or does not heat the liquid reservoir 1b) and the cooling unit 40 at the same end of the container 1 is operated to cool the liquid reservoir 1b. As a result, a gas 6 is produced in one liquid reservoir 1a increasing its internal pressure, whereas the gas 6 is forcibly cooled and thereby caused to condense in the other liquid reservoir 1b decreasing its internal pressure.

Consequently, the difference in pressure between the liquid reservoir 1a and the liquid reservoir 1b increases, producing a flow of a liquid 5 from the liquid reservoir 1a toward the liquid reservoir 1b instantaneously. Then, after a specific period of time, the liquid reservoir 1b is heated by the driving heat exchanger 4 for a particular period of time. During this time period, the cooling unit 40 provided at the liquid reservoir 1b is not operated (or does not cool the liquid reservoir 1b), whereas the driving heat exchanger 4 provided at the liquid reservoir 1a is not operated to heat it and the cooling unit 40 provided at the liquid reservoir 1a is operated to cool it.

As a result, the gas 6 is produced in the liquid reservoir 1b increasing its internal pressure, whereas the gas 6 is forcibly cooled and thereby caused to condense in the liquid reservoir 1a decreasing its internal-pressure. Consequently, the difference in pressure between the liquid reservoir 1a and the liquid reservoir 1b increases, producing a flow of a liquid 5 from the liquid reservoir 1b toward the liquid reservoir 1a instantaneously. These alternate heating and cooling cycles repetitively occur to produce oscillation of the liquid 5 in flow directions along the length of the container 1.

The heat transport device of the fifth embodiment thus constructed includes the cooling units 40 serving as the driving heat exchangers for forcibly cooling the liquid reservoirs 1a, 1b. Since this construction makes it possible to produce oscillating flows of the liquid 5 within the container 1 in a shorter period of time, an increased liquid flow velocity is achieved, enabling heat transfer from thermal-receiver-type heat exchangers 2 to thermal-radiator-type heat exchangers 3 at an increased rate. Accordingly, an important advantage of this embodiment is that it increases the capacity of heat transfer from the thermal-receiver-type heat exchangers 2 to the thermal-radiator-type heat exchangers 3.

While the fifth embodiment shows an example in which the cooling units 40 are provided on surfaces of the liquid reservoirs 1a, 1b opposite to their surfaces on which the driving heat exchangers 4 are provided, the invention is not limited to this arrangement. Needless to say, the same advantageous effect is obtained no matter on which-surfaces of the container 1 the cooling units 40 are provided as long as they are positioned at locations where a vapor phase of the liquid 5 is produced.

While other specific embodiments discussed below are provided with, or unprovided with, cooling units serving as driving heat exchangers, those embodiments may either employ, or not employ, the cooling units depending on installation site or space limitations, for instance.

Sixth Embodiment

Figure 5:
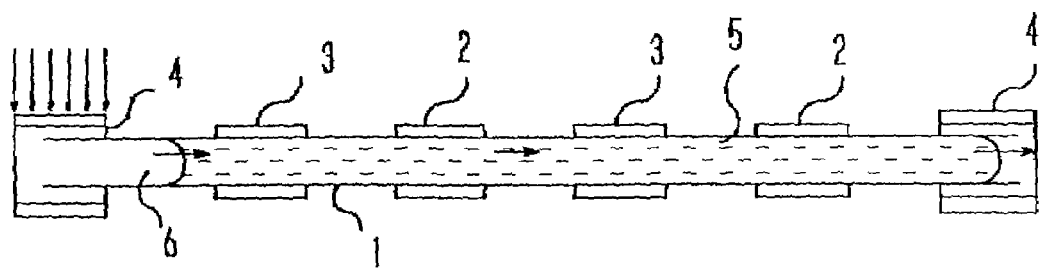
FIG. 5 is a sectional diagram showing the construction of a heat transport device according to a sixth embodiment of the invention.
Figure 6:
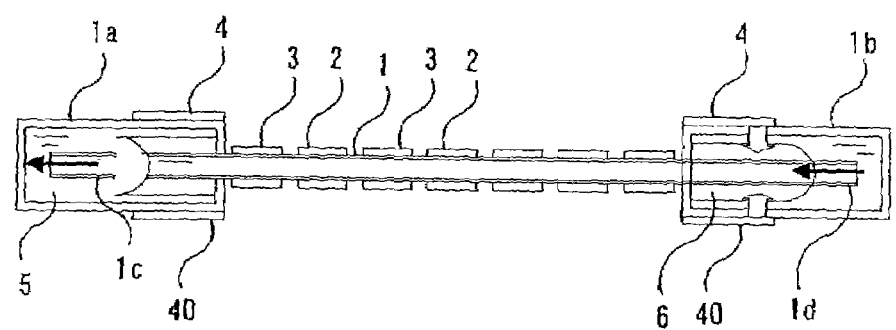
FIG. 6 is a sectional diagram showing the construction of a heat transport device according to a variation of the sixth embodiment of the invention.
Figure 7:
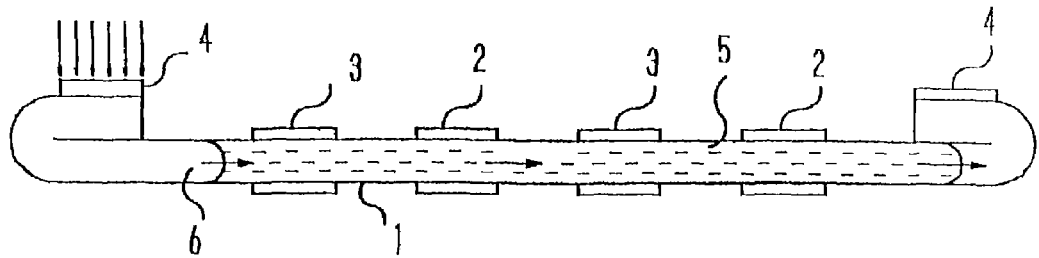
FIG. 7 is a sectional diagram showing the construction of a heat transport device according to another variation of the sixth embodiment of the invention.
Figure 8:
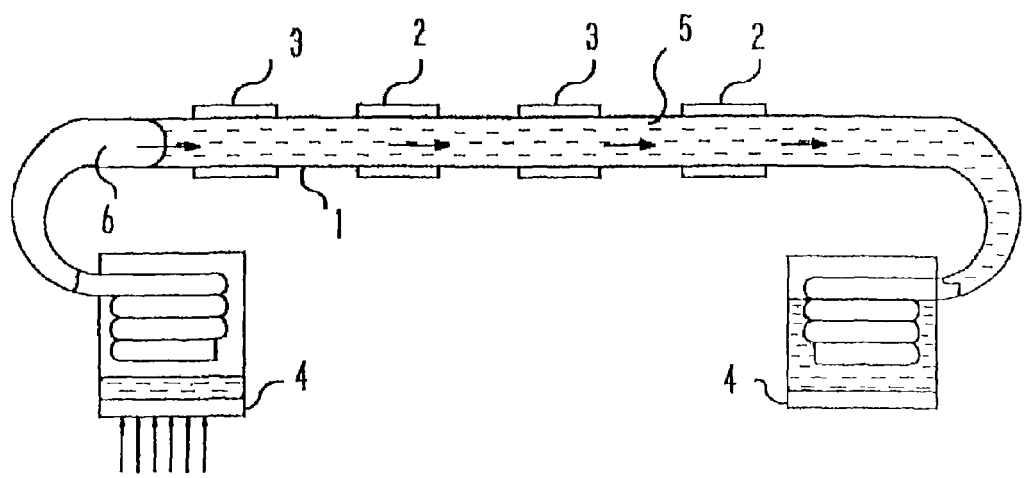
FIG. 8 is a sectional diagram showing the construction of a heat transport device according to still another variation of the sixth embodiment of the invention.

FIGS. 5–8 are sectional diagrams showing the construction of a heat transport device according to a sixth embodiment of the invention and variations thereof, in which elements identical or similar to those depicted in the foregoing embodiments are designated by the same reference numerals. The sixth embodiment employs a double pipe structure having outer pipes connected to the container 1 as shown in FIGS. 5 and 6, a double pipe structure in which both terminal portions of the container 1 are folded back as shown in FIG. 7, or a double pipe structure in which both terminal portions of the container 1 are connected to separate vessels as shown in FIG. 8.

According to the sixth embodiment as depicted in FIGS. 5, 7 and 8, heat is exchanged between a liquid 5 and a gas 6 through an outer wall of the container 1 when the liquid 5 has returned to either of the terminal portions of the container 1 where driving heat exchangers 4 are provided. The gas 6 is cooled and condensed, causing a drop in internal pressure and producing a great liquid driving pressure. With the double pipe structures of FIGS. 5, 7 and 8, it is possible to cause the liquid 5 to oscillate at shorter recurring cycles and transport heat from thermal-receiver-type heat exchangers 2 to thermal-radiator-type heat exchangers 3 with a higher efficiency.

The heat transport device in one variation of the sixth embodiment shown in FIG. 6 is provided with liquid reservoirs 1a, 1b at both ends of the container 1. Inner tubes 1c, 1d are fitted in the liquid reservoirs 1a, 1b, respectively, forming a double pipe structure inside the liquid reservoirs 1a, 1b. Since the inner tubes 1c, 1d are fitted in the liquid reservoirs 1a, 1b in this fashion, both ends of the container 1 are located inside the liquid reservoirs 1a, 1b. Driving heat exchangers 4 and cooling units 40 are provided where both ends of the container 1 are located.

According to the construction of FIG. 6, heat is exchanged between the liquid 5 and the gas 6 through the wall of the inner tube 1c when the liquid 5 has returned to the liquid reservoir 1a, for instance, whereby the gas 6 is cooled and condensed, causing a drop in internal pressure of the liquid reservoir 1a. This produces a great liquid driving pressure and causes the liquid 5 to flow at a higher velocity. When the liquid 5 has returned to the liquid reservoir 1b, on the other hand, heat is exchanged between the liquid 5 and the gas 6 through the wall of the inner tube 1d, whereby the gas 6 is cooled and condensed, causing a drop in internal pressure of the liquid reservoir 1b. This produces a great liquid driving pressure and causes the liquid 5 to flow in an opposite direction at a higher velocity.

Since the liquid 5 can be caused to oscillate at shorter recurring cycles in this manner, the embodiment provides an advantage that heat can be transported from the thermal-receiver-type heat exchangers 2 to the thermal-radiator-type heat exchangers 3 with an increased efficiency.

Seventh Embodiment

Figure 9:
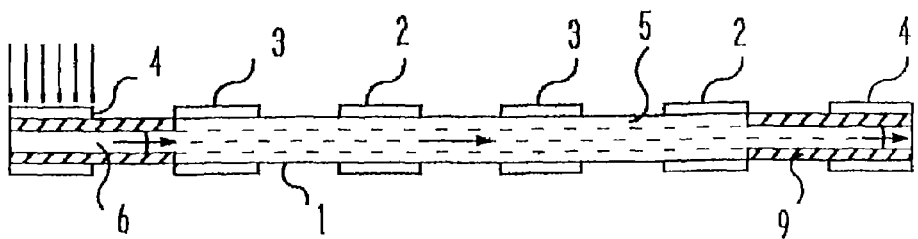
FIG. 9 is a sectional diagram showing the construction of a heat transport device according to a seventh embodiment of the invention.
Figure 10A:
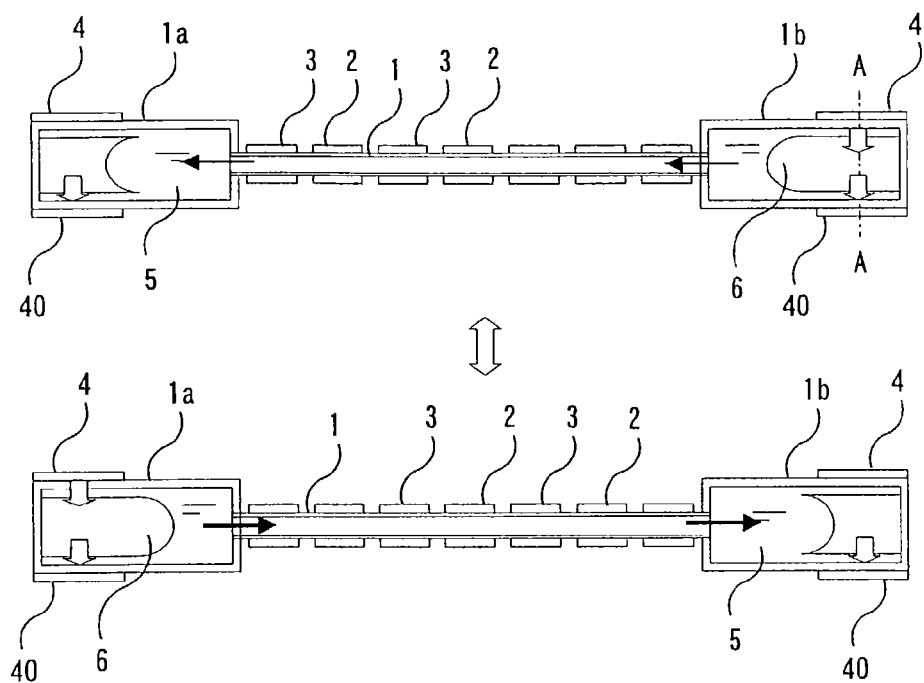
FIGS. 10A–10B are sectional diagrams showing the construction of a heat transport device according to a variation of the seventh embodiment of the invention.
Figure 10B:
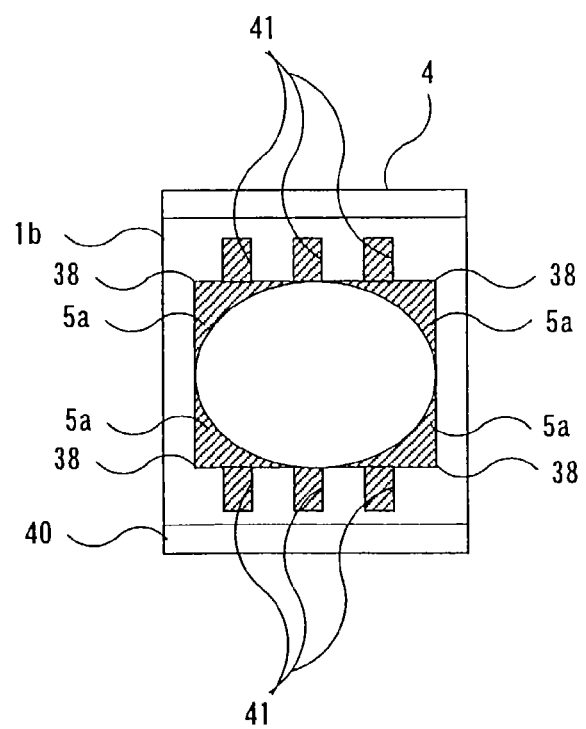

FIGS. 9 and 10A–10B are sectional diagrams showing the construction of a heat transport device according to a seventh embodiment f the invention and a variation thereof, in which elements identical or similar to those depicted in the foregoing embodiments are designated by the same reference numerals. The construction of this embodiment is characterized in that grooves or porous elements 9 formed of a porous material serving as pores which produce a capillary action are provided inside both terminal portions of the container 1 where driving heat exchangers 4 are provided, or narrow grooves 41 are formed at both terminal portions of the container 1 where the driving heat exchangers 4 are provided.

In the heat transport device of FIG. 9 provided with the porous elements 9 at the terminal portions of the container 1 where the driving heat exchangers 4 are provided, it is possible to supplement the amount of the liquid 5 consumed by evaporation or boiling with the aid of the capillary action. Furthermore, since inside wall surfaces of the container 1 at its terminal portions can easily retain the liquid 5, they become less likely to dry out. It is therefore possible to use high heat flux heat exchangers as the driving heat exchangers 4.

Furthermore, the porous elements 9 serve to release the gas 6 by evaporating the liquid 5 and thereby maintain a driving force for moving the liquid 5 for an extended period of time, making it possible to increase the distance of oscillation-assisted movement of the liquid 5.

In addition, pores (or grooves) in the porous elements 9 act just like nuclei for producing the gas (vapor bubbles) 6, so that the gas 6 can easily develop and, as a consequence, it becomes possible to reduce the period of oscillation of the liquid 5.

The heat transport device in one variation of the seventh embodiment shown in FIGS. 10A–10B is provided with liquid reservoirs 1a, 1b at both ends of the container 1. The aforementioned narrow grooves 41 serving as pores which produce a capillary action are formed in inside wall surfaces of the liquid reservoirs 1a, 1b along their axial direction. The liquid reservoirs 1a, 1b are heated by respective driving heat exchangers 4 and cooled by respective cooling units 40 in a manner similar to the foregoing embodiments. The liquid 5 seeps from the liquid reservoirs 1a, 1b into the grooves 41 due to the capillary action. In this construction, the driving heat exchangers 4 heat and the cooling units 40 cool not only liquid fillets 5a formed along internal corners 38 of the liquid reservoirs 1a, 1b but also liquid masses held in the grooves 41, so that heating and cooling can be performed over broader areas of the liquid reservoirs 1a, 1b.

In the construction of FIGS. 10A–10B, both the amount of heat of evaporation per unit time and the rate of pressure rise increase so that the internal pressure of the liquid reservoirs 1a, 1b rises and drops more instantaneously. Accordingly, this construction offers such advantageous effects that the oscillating frequency of the liquid 5 in the container 1 and the amount of transported heat are increased.

Also, the construction of FIGS. 10A–10B is advantageous in that the liquid masses held in the grooves 41 easily evaporate when heated by the driving heat exchangers 4 even if the container 1 is not rectangular-shaped but circle-shaped in cross section having no internal corners 38. Furthermore, although the heat transport device of FIGS. 10A–10B employs the grooves 41 to allow the liquid 5 to seep along the inside wall surfaces of the liquid reservoirs 1a, 1b, alternative means may be adopted instead of these grooves 41. For example, a mesh structure, sintered metal or porous ceramic material which allows the liquid 5 to seep along the wall surfaces of the liquid reservoirs 1a, 1b may be used to achieve the same advantageous effects as the grooves 41.

Eighth Embodiment

Figure 11:
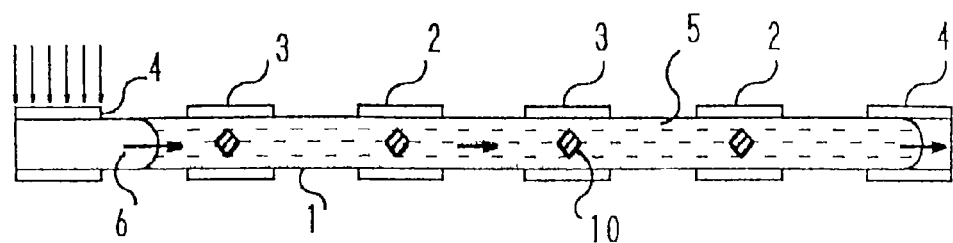
FIG. 11 is a sectional diagram showing the construction of a heat transport device according to an eighth embodiment of the invention.

FIG. 11 is a sectional diagram showing the construction of a heat transport device according to an eighth embodiment of the invention, in which elements identical or similar to those depicted in FIGS. 1A–1B are designated by the same reference numerals. The construction of this embodiment is characterized in that there are provided turbulence accelerators 10 in the container 1 at its portions where the thermal-receiver-type heat exchangers 2 and the thermal-radiator-type heat exchangers 3 are provided.

Located at the portions of the container 1 where the thermal-receiver-type heat exchangers 2 and the thermal-radiator-type heat exchangers 3 are provided, the turbulence accelerators 10 produce turbulences in the liquid 5 as it oscillates left and right. This construction makes it possible to considerably enhance the heat transfer performance of the heat transport device without causing a substantial increase in pressure loss within a fluid channel in the whole container 1.

Figure 12A:
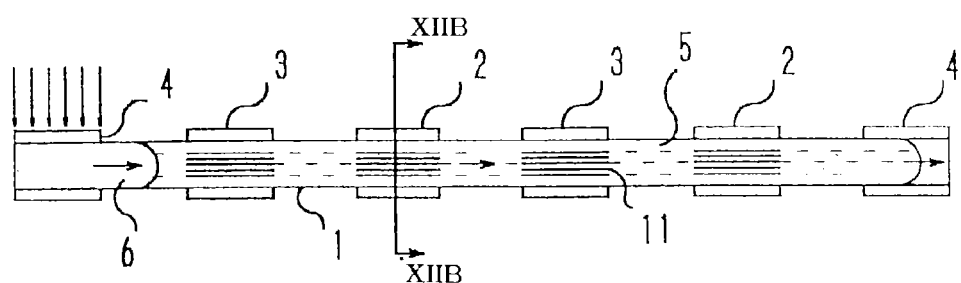
FIGS. 12A–12B are sectional diagrams showing the construction of a heat transport device according to a variation of the eighth embodiment of the invention.
Figure 12B:

The construction of the heat transport device of FIG. 11 may be modified by replacing the turbulence accelerators 10 with microchannel chips 11 as shown in FIGS. 12A–12B, of which FIG. 12B is a sectional view of the microchannel chip 11 taken along line XIIB—XIIB of FIG. 12A. The microchannel chip 11 is formed of multiple straight fins, pin fins, a porous material or foam metal, and has a number of narrow flow paths. This variation of the embodiment offers the same advantageous effect as the construction of FIG. 11.

Ninth Embodiment

FIGS. 13A–13D are fragmentary sectional diagrams showing the construction of a heat transport device according to a ninth embodiment of the invention, in which elements identical or similar to those depicted in the foregoing embodiments are designated by the same reference numerals. In this embodiment, a hole 13 is formed in an inside wall surface 12 of the container 1 and a plug-like insert 14 is fitted in the hole 13 in such a fashion that a hollow space is formed at the bottom of the hole 13 as shown in FIG. 13A.

According to the construction of this embodiment, the gas 6 is formed at the bottom of the hole 13 in a stable fashion, so that a vapor bubble 15 easily develops from between the inside wall surface 12 and the insert 14. Since the space between the insert 14 and the bottom of the hole 13 serves as a nucleus for bubble formation and the vapor bubble 15 produced therefrom stirs up the liquid 5 adjacent to the inside wall surface 12, heat transfer efficiency is increased close to the inside wall surface 12. In addition, it is possible to controllably select the position where the vapor bubble 15 is produced by providing the hole 13 and the insert 14 at a desired location.

Preferably, one or more grooves should be formed along a side surface of the insert 14 to connect the hollow space at the bottom of the hole 13 to the liquid 5 lying in contact with the inside wall surface 12 as illustrated in FIGS. 13B–13D taken along the section line of FIG. 13A.

The heat transfer efficiency can be further improved by forming more than one such hole 13 fitted with the insert 14 in the inside wall surface 12.

Tenth Embodiment

FIGS. 14A–14B are fragmentary sectional diagrams showing the construction of a heat transport device according to a tenth embodiment of the invention, FIG. 14B being an enlarged view of a portion A shown in FIG. 14A. In these Figures, elements identical or similar to those depicted in the foregoing embodiments are designated by the same reference numerals. The construction of this embodiment is characterized in that there is formed a cavity 16 in a bottom surface of the insert 14 itself as shown in FIG. 14A.

As depicted in FIG. 14B, angle θ formed by surfaces of the hole 13 and the insert 14 increases when the cavity 16 is formed in the bottom surface of the insert 14. An advantage of this structure is that the gas 6 can stay in the hollow space bounded by the bottom of the hole 13 and the cavity 16 in a more stable fashion and a vapor bubble 15 can develop more easily.

Eleventh Embodiment

Figure 15A:
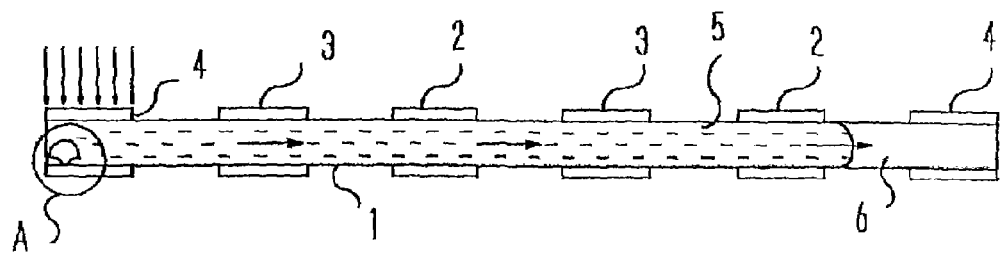
FIGS. 15A–15B are fragmentary sectional diagrams showing the construction of a heat transport device according to an eleventh embodiment of the invention.
Figure 15B:
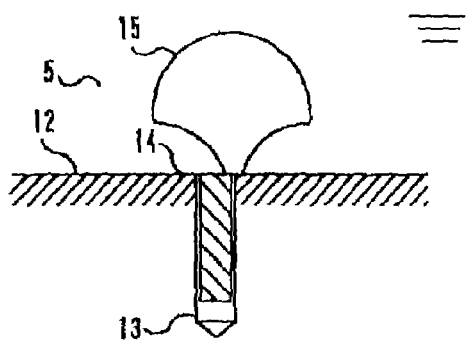

FIGS. 15A–15B are sectional diagrams showing the construction of a heat transport device according to an eleventh embodiment of the invention, FIG. 15B being an enlarged view of a portion A shown in FIG. 15A. In these Figures, elements identical or similar to those depicted in the foregoing embodiments are designated by the same reference numerals. In this embodiment, a hole 13 fitted with an insert 14 having the same structure as that of the ninth or tenth embodiment is provided at least at one terminal portion of the inside wall surface 12 of the container 1 where the driving heat exchanger 4 is provided.

In this embodiment, a vapor bubble 15 develops more easily from the inside wall surface 12 of the container 1 at its terminal portion where the driving heat exchanger 4 is provided, making it possible to reduce the period of oscillation of the liquid 5.

Since the hole 13 fitted with the insert 14 is provided at the terminal portion of the container 1, the vapor bubble 15 develops from that portion of the container 1. This makes it possible to increase the distance of movement of the liquid 5 and further enhance the heat transfer performance of the heat transport device.

If a cavity 16 is formed in a bottom surface of the insert 14, the gas 6 can stay at the bottom of the hole 13 in a more stable fashion and the vapor bubble 15 can develop more easily.

Twelfth Embodiment

Figure 16:
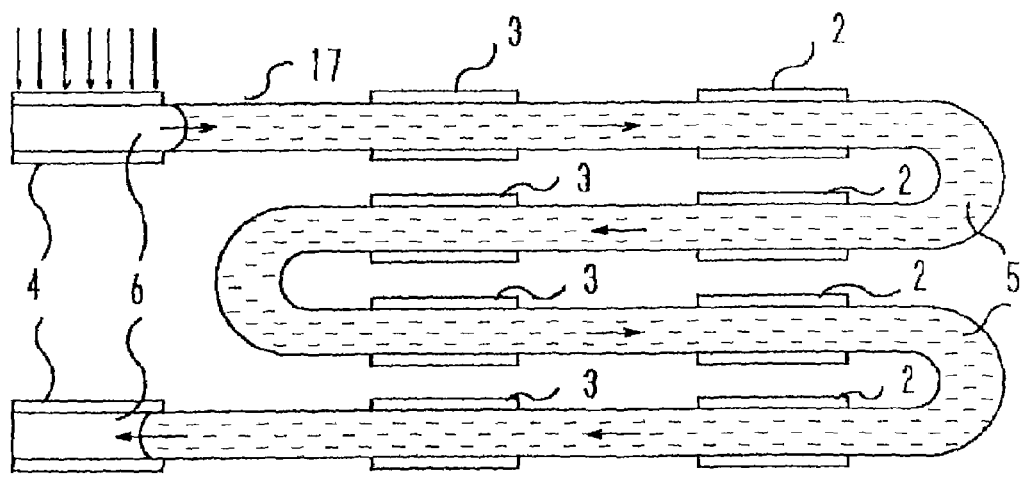
FIG. 16 is a sectional diagram showing the construction of a heat transport device according to a twelfth embodiment of the invention.
Figure 17:
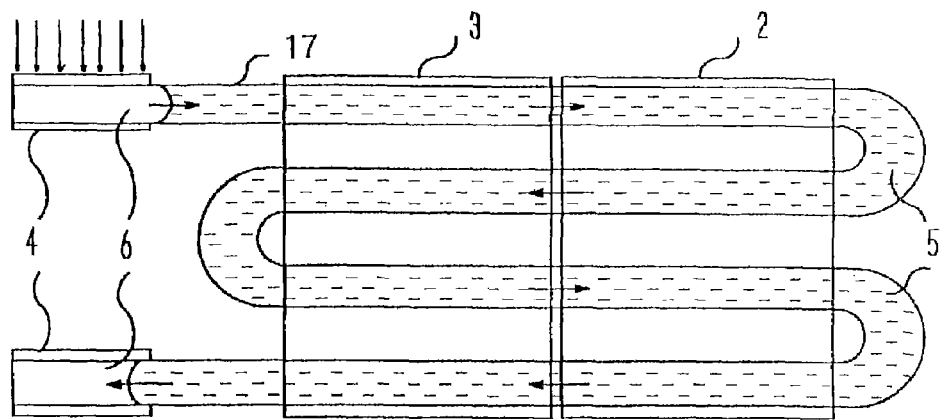
FIG. 17 is a sectional diagram showing the construction of a heat transport device according to a variation of the twelfth embodiment of the invention.

FIGS. 16–17 are sectional diagrams showing the construction of a heat transport device according to a twelfth embodiment of the invention and a variation thereof, in which elements identical or similar to those depicted in the foregoing embodiments are designated by the same reference numerals. The twelfth embodiment is characterized in that it employs a meandering pipe 17 instead of the container 1 of the foregoing embodiments.

By using the meandering pipe 17 in any of the foregoing embodiments, heat can be easily carried away from randomly located heat sources.

If a thermal-receiver-type heat exchanger 2 and a thermal-radiator-type heat exchanger 3 are flat-shaped as shown in FIG. 17, the overall surface area of heat exchange increases, offering a higher efficiency of heat exchange.

Thirteenth Embodiment

Figure 18:
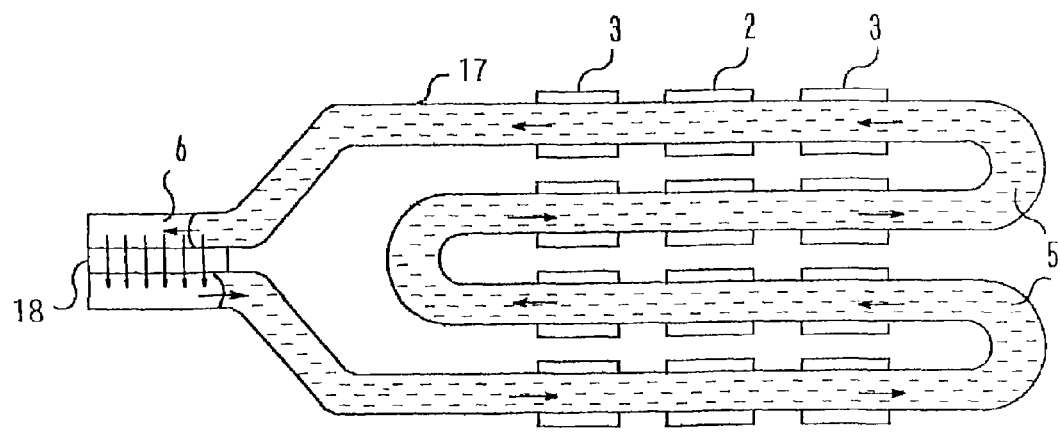
FIG. 18 is a sectional diagram showing the construction of a heat transport device according to a thirteenth embodiment of the invention.

FIG. 18 is a sectional diagram showing the construction of a heat transport device according to a thirteenth embodiment of the invention, in which elements identical or similar to those depicted in the foregoing embodiments are designated by the same reference numerals. The construction of this embodiment is characterized in that both terminal portions of a meandering pipe 17 are joined to each other with a Peltier element 18 placed in between, the Peltier element 18 serving as a driving heat exchanger.

In this embodiment, the direction of an electric current flowing through the Peltier element 18 is periodically reversed so that one end of the meandering pipe 17 is heated while the other end of the meandering pipe 17 is cooled, and vice versa, causing the liquid 5 in the meandering pipe 17 to oscillate. This means that the Peltier element 18 serves as a driving heat exchanger having the functions of both a heating unit and a cooling unit.

Since the gas 6 produced by the heating condenses when cooled as a result of the reversing of the electric current, a large pressure difference is produced between both terminal portions of the meandering pipe 17. This makes it possible to reduce the period of oscillation of the liquid 5, enabling more efficient heat transfer operation.

Furthermore, since the pressure difference between both terminal portions of the meandering pipe 17 can be increased as stated above, a resultant driving force permits satisfactory heat transfer operation even when the length of the meandering pipe 17 is increased or the liquid 5 has a large flow resistance. The meandering pipe 17 of this embodiment as well as the one of the twelfth embodiment need not necessarily be constructed as illustrated in FIGS. 16–18 but may a two-fold container.

Fourteenth Embodiment

Figure 19:
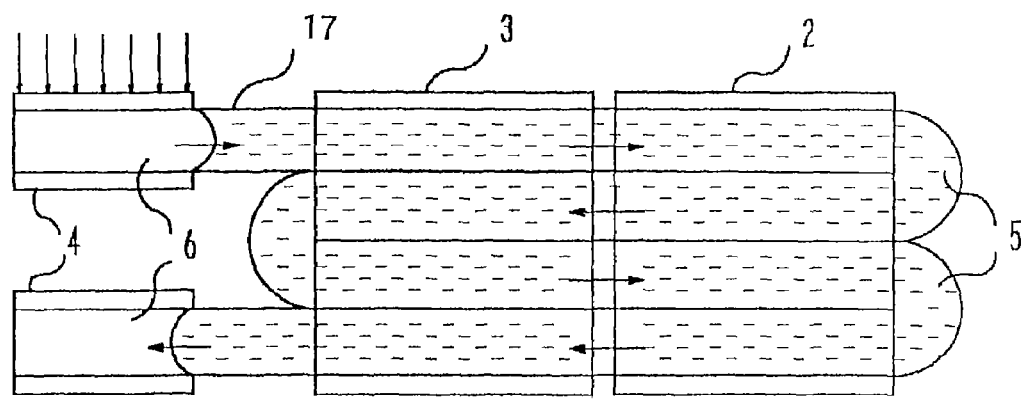
FIG. 19 is a sectional diagram showing the construction of a heat transport device according to a fourteenth embodiment of the invention.

FIG. 19 is a sectional diagram showing the construction of a heat transport device according to a fourteenth embodiment of the invention, in which elements identical or similar to those depicted in the foregoing embodiments are designated by the same reference numerals. The construction of this embodiment is characterized in that a meandering pipe 17 is structured such that heat is properly transferred between adjacent portions of the wall of the meandering pipe 17. In the construction shown in FIG. 19, the adjacent portions of the wall of the meandering pipe 17 are in mutual contact and joined together by welding, brazing or adhesive bonding.

Figure 20:
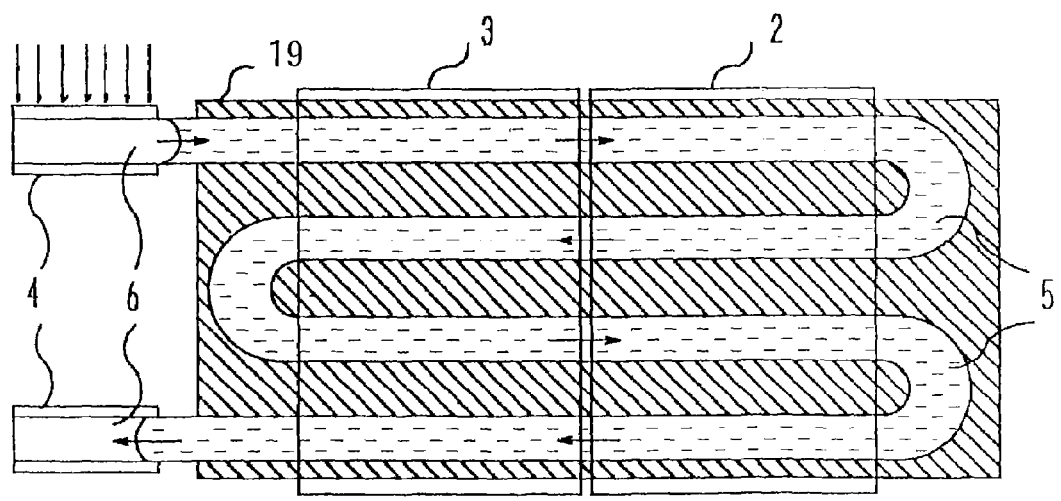
FIG. 20 is a sectional diagram showing the construction of a heat transport device according to a variation of the fourteenth embodiment of the invention.

In one variation of the embodiment shown in FIG. 20, a meandering groove is formed in a flat plate and a meandering fluid channel 19 is fitted in the meandering groove, forming a single structure with the flat plate. Since adjacent portions of the wall of the meandering fluid channel 19 are joined to each other by the flat plate, heat is properly transferred between them.

Alternatively, a meandering pipe 17 may be molded by a material having a high thermal conductivity such that adjacent portions of the wall of the meandering pipe 17 are united into a single structure and heat is properly transferred between those portions.

Figure 21A:
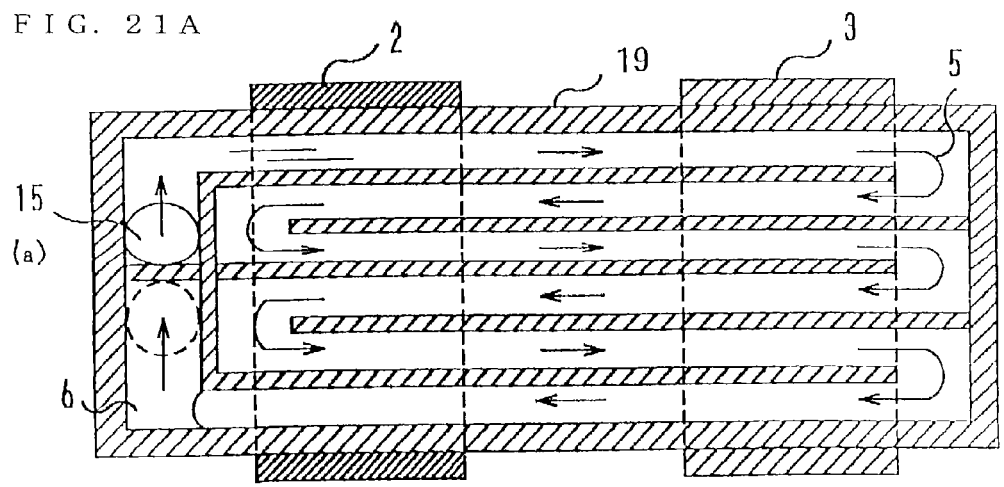
FIGS. 21A–21B are sectional diagrams showing the construction of a heat transport device according to another variation of the fourteenth embodiment of the invention.
Figure 21B:
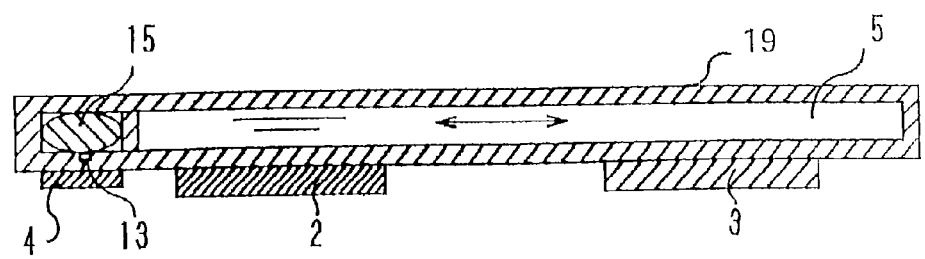

In another variation of the embodiment shown in FIGS. 21A–21B, a meandering fluid channel 19 is formed by making contiguous inner walls in a container. Since adjacent portions of the meandering fluid channel 19 are separated by the contiguous inner walls but formed in a single structure, heat is properly transferred between those portions.

The aforementioned constructions of this embodiment provide an improved efficiency of heat exchange between a thermal-receiver-type heat exchanger 2 and a thermal-radiator-type heat exchanger 3 as heat is not only transported by oscillation of the liquid 5 but dissipated between the adjacent portions of the meandering pipe 17 or of the meandering fluid channel 19.

Figure 22:
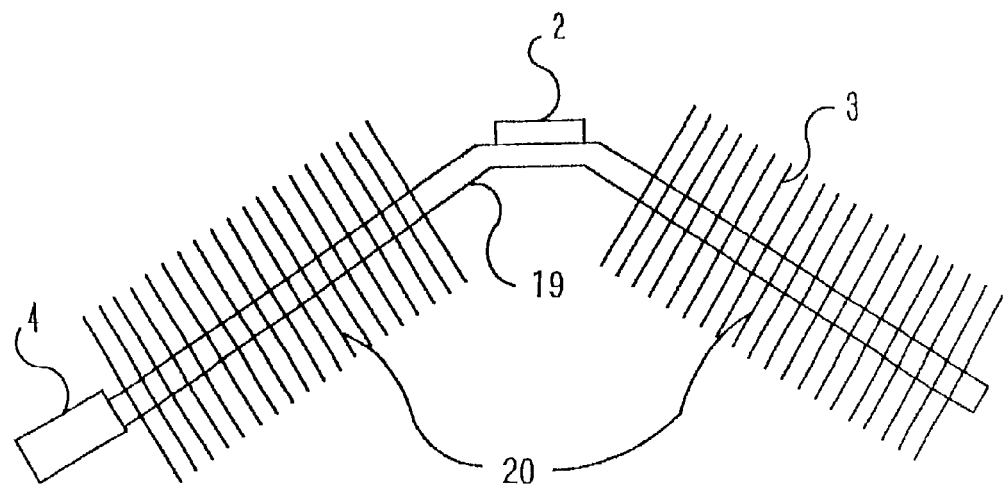
FIG. 22 is a sectional diagram showing the construction of a heat transport device according to still another variation of the fourteenth embodiment of the invention.
Figure 23A:
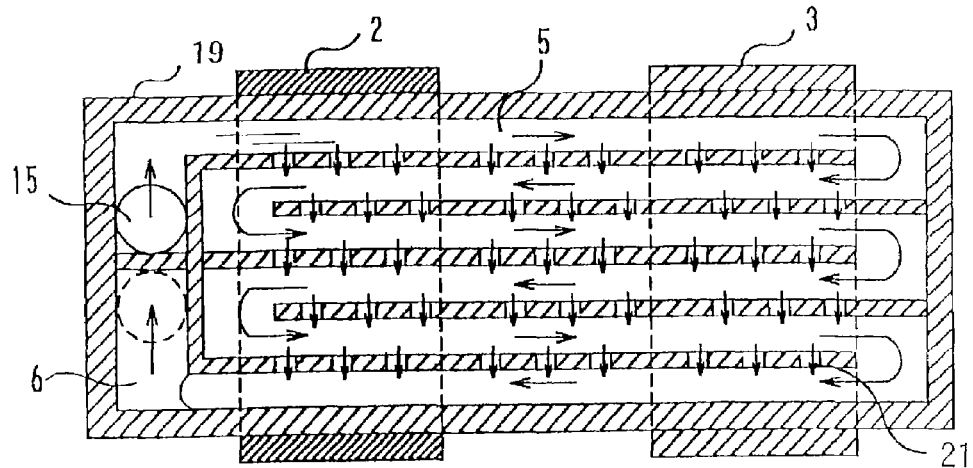
FIGS. 23A–23B are sectional diagrams showing the construction of a heat transport device according to a fifteenth embodiment of the invention.
Figure 23B:
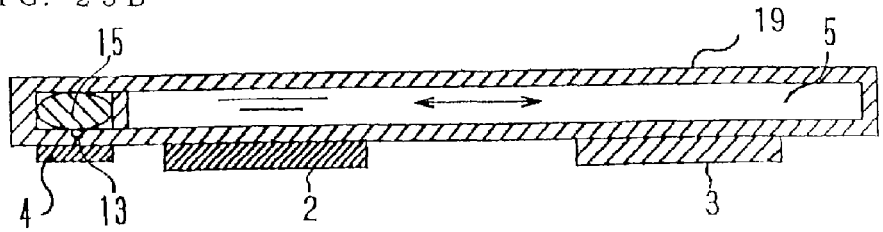
Figure 24A:
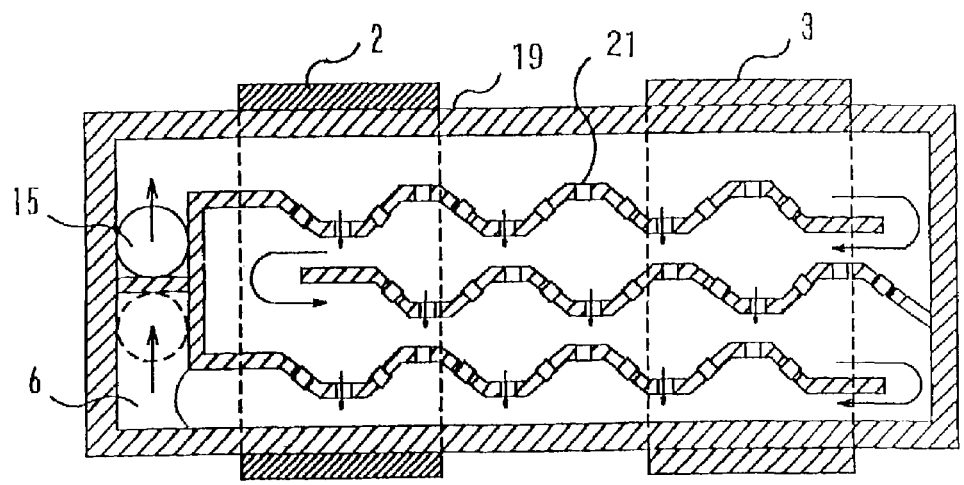
FIGS. 24A–24B are sectional diagrams showing the construction of a heat transport device according to a variation of the fifteenth embodiment of the invention.
Figure 24B:
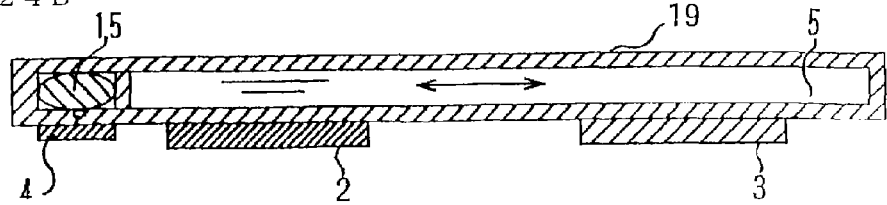

The variations of the embodiment shown in FIGS. 20 and 21A–21B provide flat-shaped heat transport devices which can be easily bent or otherwise deformed. If there is an obstacle in a heat radiating area where the thermal-radiator-type heat exchanger 3 should be situated, the heat transport device may be formed in an odd shape as illustrated in FIG. 22, for example. In this variation of the embodiment, the thermal-radiator-type heat exchanger 3 is formed of multiple fins 20 attached to radiating portions of a meandering fluid channel 19 to effectively use their two opposite surfaces.

Fifteenth Embodiment

FIGS. 23A–23B, 24A–24B are sectional diagrams showing the construction of a heat transport device according to a fifteenth embodiment of the invention and a variation thereof, in which elements identical or similar to those depicted in the foregoing embodiments are designated by the same reference numerals. The heat transport device of this embodiment has a meandering fluid channel 19 similar to that of the fourteenth embodiment, but there are formed bypass holes 21 in inner walls separating adjacent portions of the meandering fluid channel 19.

Since the liquid 5 is allowed to pass from one side of the inner wall to the other through the bypass holes 21 in this construction, the embodiment makes it possible to dissipate heat more positively.

Sixteenth Embodiment

Figure 25:
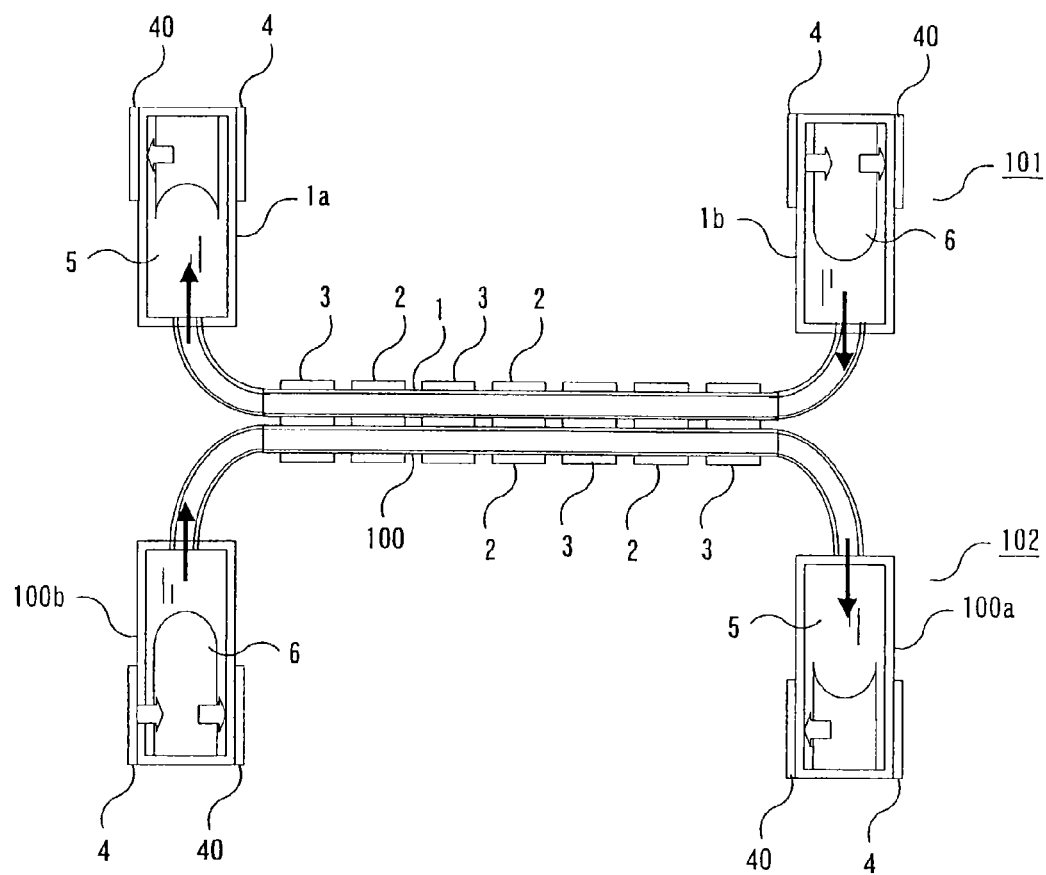
FIG. 25 is a sectional diagram showing the construction of a heat transport device according to a sixteenth embodiment of the invention.
Figure 26:
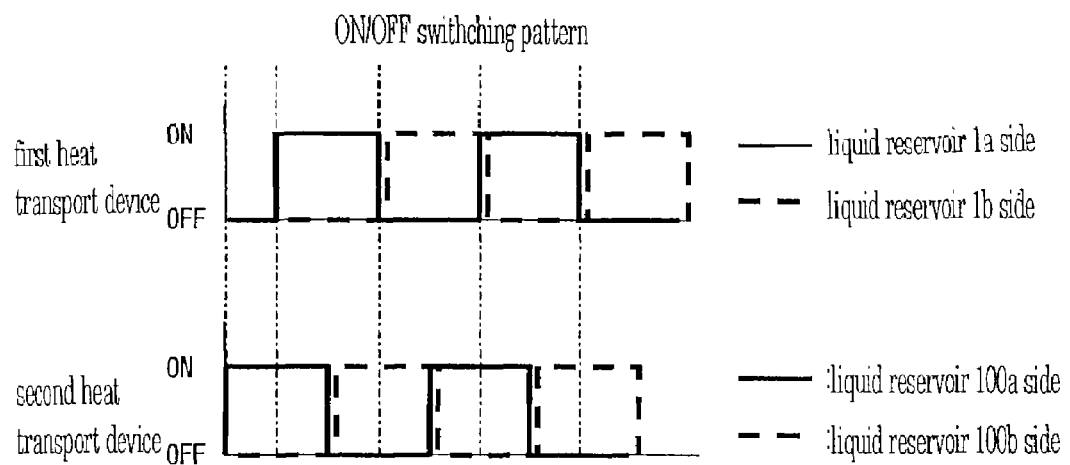
FIG. 26 is a diagram showing a heat control method of the heat transport device of FIG. 25.

FIG. 25 is a sectional diagram showing the construction of a heat transport device according to a sixteenth embodiment of the invention, and FIG. 26 is a diagram showing a heat control method of the heat transport device of FIG. 25. In these Figures, elements identical or similar to those depicted in the foregoing embodiments are designated by the same reference numerals and their description is omitted here. While the heat transport device of each of the foregoing embodiments has the single container 1 on which the thermal-receiver-type heat exchangers 2 and the thermal-radiator-type heat exchangers 3 are provided in direct contact, multiple containers (1 and 100 in the example of FIG. 25), each having a structure similar to the container 1 of the foregoing embodiments, are provided adjacent to each other in this embodiment.

As shown in FIG. 25, the heat transport device of the sixteenth embodiment includes a first heat transport device 101 and a second heat transport device 102. The first heat transport device 101 is provided with liquid reservoirs 1a, 1b at both ends of the container 1 while the second heat transport device 102 is provided with liquid reservoirs 100a, 100b at both ends of the container 100.

Operation of the heat transport device of the sixteenth embodiment constructed as shown in FIG. 25 is now described referring also to FIG. 26 which shows an example of an ON/OFF switching pattern of individual driving heat exchangers 4 of the first and second heat transport devices 101, 102. As can been seen from ON/OFF timings of the individual driving heat exchangers 4 shown in FIG. 26, the driving heat exchangers 4 provided on the liquid reservoirs 1a, 1b of the first heat transport device 101 and the driving heat exchangers 4 provided on the liquid reservoirs 100a, 100b of the second heat transport device 102 are turned on and off at the same intervals (or period) but with a time delay equal to a half-cycle duration. It is to be pointed out that the time delay in ON/OFF timing need not necessarily be equal to the half-cycle duration for implementing the invention but may be set to other duration.

Since the flow direction of the liquid 5 is reversed the moment that the ON/OFF status of the driving heat exchangers 4 of the first heat transport device 101 is switched, the liquid flow velocity temporarily decreases and, in certain cases, the liquid 5 may be caused to stop flowing in the container 1. Should this situation take place, the amount of heat transported from thermal-receiver-type heat exchangers 2 to the liquid 5 in the container 1 decreases and, as a consequence, the temperature of the thermal-receiver-type heat exchangers 2 of the first heat transport device 101 tends to increase. Since the driving heat exchangers 4 of the second heat transport device 102 are not switched at the same timing, however, the liquid flow velocity in the container 100 of the second heat transport device 102 remains unchanged. Thus, a particular amount of heat is transported from the thermal-receiver-type heat exchangers 2 to the liquid 5 in the container 100 of the second heat transport device 102, and this helps prevent temperature increase of the thermal-receiver-type heat exchangers 2.

Likewise, the flow direction of the liquid 5 is reversed the moment that the ON/OFF status of the driving heat exchangers 4 of the second heat transport device 102 is switched, so that the liquid flow velocity temporarily decreases and, in certain cases, the liquid 5 may be caused to stop flowing in the container 1. Should this situation take place, the amount of heat transported from the thermal-receiver-type heat exchangers 2 to the liquid 5 in the container 100 decreases and, as a consequence, the temperature of the thermal-receiver-type heat exchangers 2 of the second heat transport device 102 tends to increase. Since the driving heat exchangers 4 of the first heat transport device 101 are not switched at the same timing, however, the liquid flow velocity in the container 1 of the first heat transport device 101 remains unchanged. Thus, a particular amount of heat is transported from the thermal-receiver-type heat exchangers 2 to the liquid 5 in the container 1 of the first heat transport device 101, and this helps prevent temperature increase of the thermal-receiver-type heat exchangers 2.

The heat transport device of the sixteenth embodiment constructed as described above produces the same advantageous effect as the foregoing embodiments. Furthermore, the amount of heat transported from the thermal-receiver-type heat exchangers 2 to thermal-radiator-type heat exchangers 3 is doubled because the two heat transport devices 101, 102 are simultaneously run. Moreover, since the driving heat exchangers 4 of the first heat transport device 101 and those of the second heat transport device 102 are switched with a specific time delay, temperature fluctuation of the thermal-receiver-type heat exchangers 2 can be reduced.

While the foregoing discussion of the sixteenth embodiment has not dealt with operation for controlling cooling units 40 provided on the liquid reservoirs 1a, 1b, 100a, 100b, the cooling units 40 may be turned on and off alternately with the corresponding driving heat exchangers 4. If the driving heat exchangers 4 and the cooling units 40 are switched in this fashion, the aforementioned temporary drop in the liquid flow velocity is further decreased and temperature fluctuation of the thermal-receiver-type heat exchangers 2 is further reduced.

Although the two heat transport devices 101, 102 are combined in the sixteenth embodiment described above, the invention is not limited to this configuration but can be implemented by combining three or more heat transport devices. What is essential in this embodiment is that the driving heat exchangers 4 of the individual heat transport devices should be controlled with different ON/OFF timings.

Seventeenth Embodiment

Figure 27A:
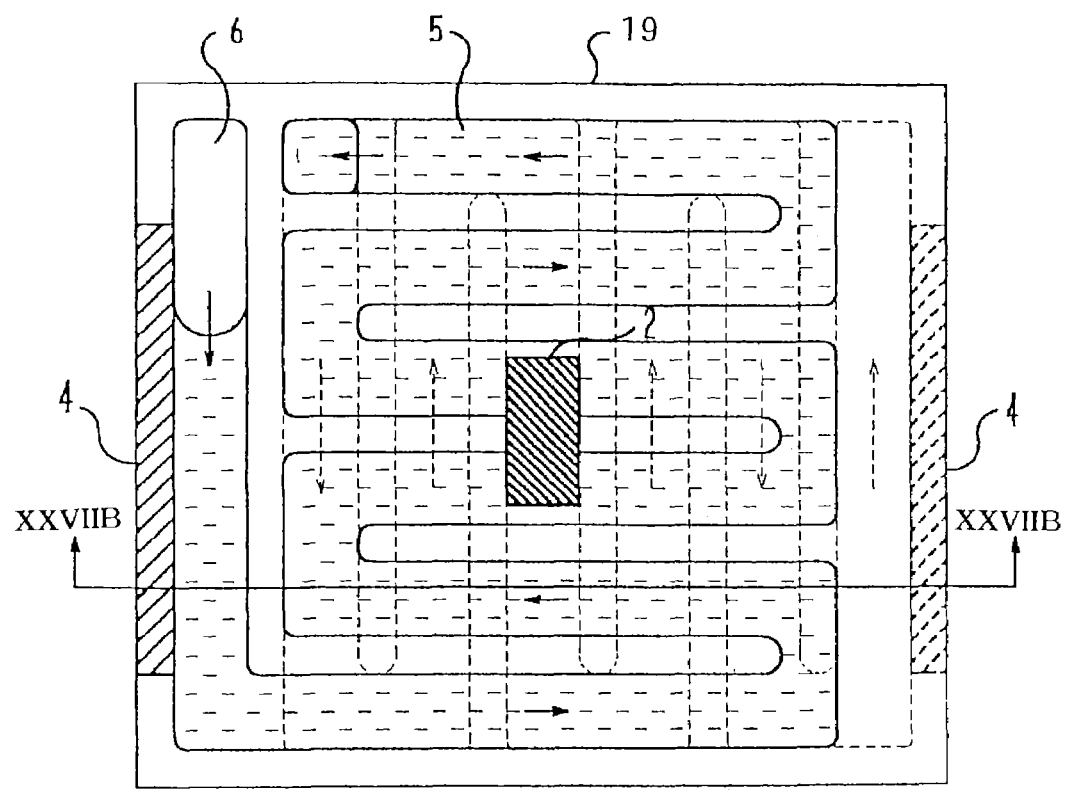
FIGS. 27A–27B are sectional diagrams showing the construction of a heat transport device according to a seventeenth embodiment of the invention.
Figure 27B:
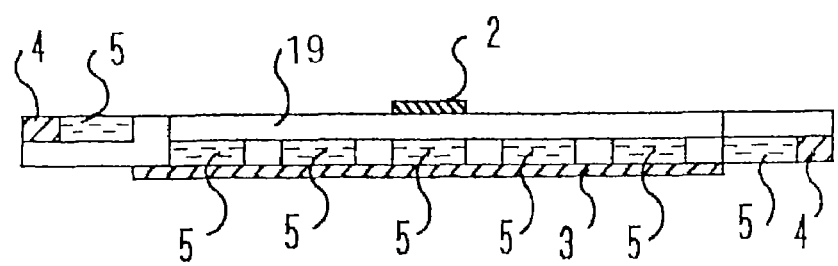

FIG. 27A is a sectional plan view showing the construction of a heat transport device according to a seventeenth embodiment of the invention and FIG. 27B is a horizontal sectional view taken along line XXVIIB—XXVIIB of FIG. 27A. In these Figures, elements identical or similar to those depicted in the foregoing embodiments are designated by the same reference numerals. The construction of this embodiment is characterized in that multiple layers of meandering fluid channels 19 are stacked one on top of another in a manner that the flow direction of the liquid 5 in one layer is the same as, opposite to, or perpendicular to the flow direction of the liquid 5 in another layer.

This embodiment helps achieve a higher heat transfer efficiency as heat is dissipated in two- or three-dimensional fashion.

Specific examples employing the construction of the seventeenth embodiment are described below.

Figure 28A:
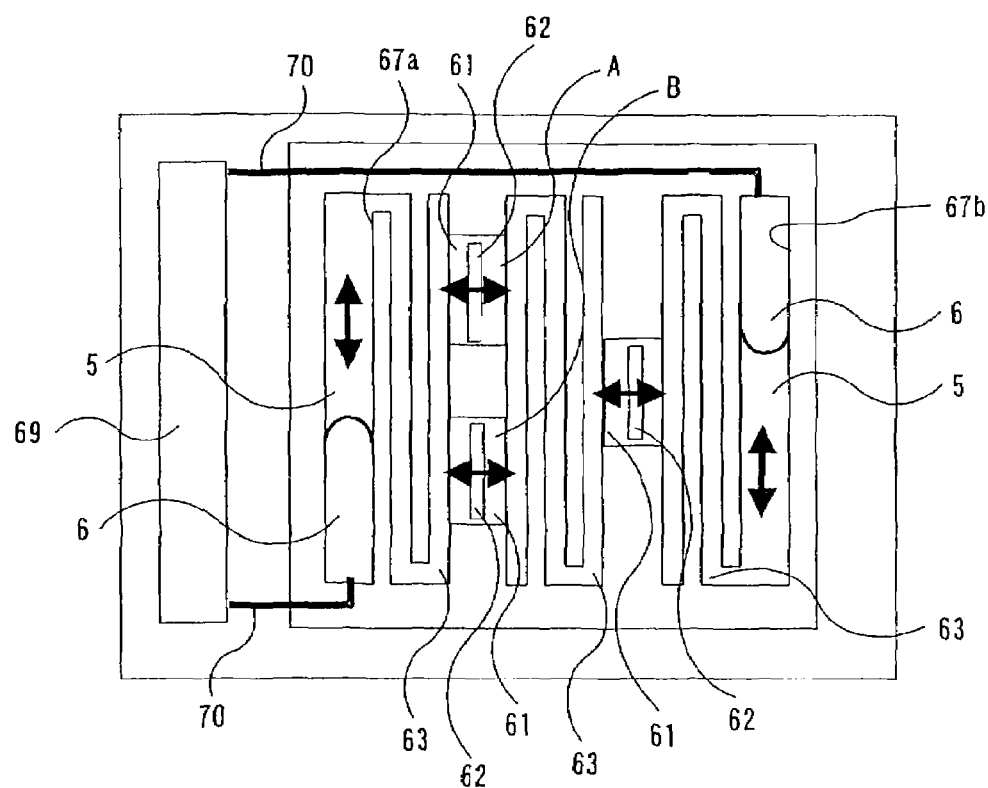
FIGS. 28A–28B are sectional diagrams showing an semiconductor apparatus employing the heat transport device according to the seventeenth embodiment.
Figure 28B:
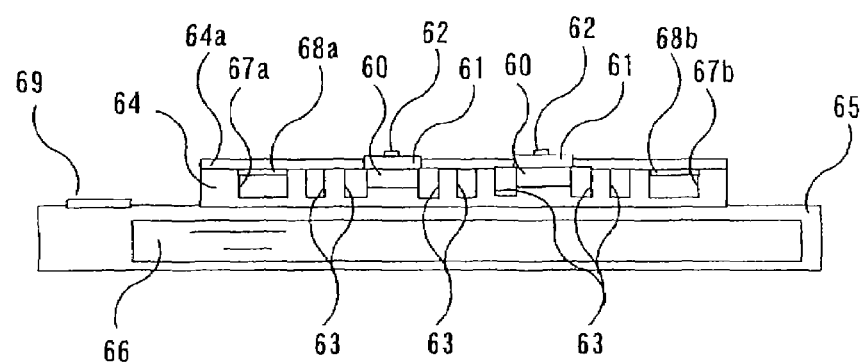
Figure 29A:
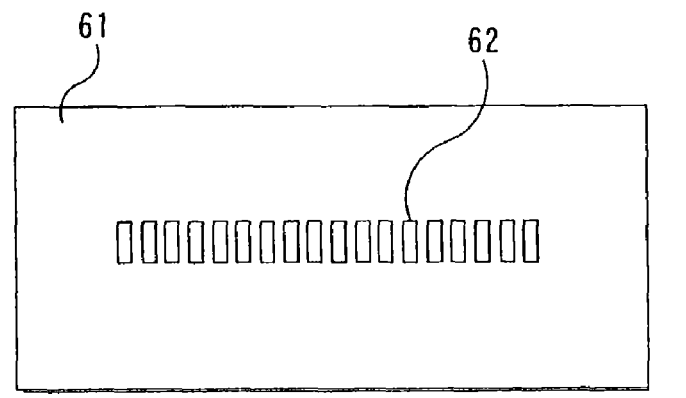
FIGS. 29A–29B are diagrams showing the construction of a semiconductor device used in the semiconductor apparatus of FIGS. 28A–28B.
Figure 29B:
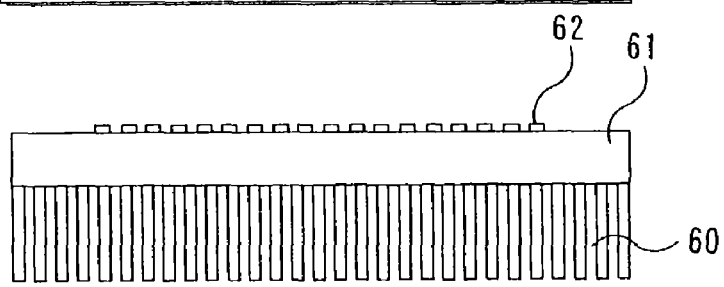

FIGS. 28A–28B are sectional diagrams showing an semiconductor apparatus employing the heat transport device according to the seventeenth embodiment of the invention for cooling semiconductor devices, and FIGS. 29A–29B are diagrams showing the construction of the semiconductor device used in the semiconductor apparatus of FIGS. 28A–28B.

As shown in FIGS. 29A–29B, the semiconductor device is a chip 61 formed of a semiconductor material, e.g., gallium nitride (GaN), measuring 2 mm wide, 3 mm long and 2 mm high, for example. A heat-generating element 62 is incorporated in the chip 61 and a microchannel block 60 formed at a lower part of the chip 61 has a number of grooves each measuring 100 $\mu$m wide and 300 $\mu$m deep. The microchannel block 60 of this example corresponds to the aforementioned thermal-receiver-type heat exchanger 2.

Microchannel blocks 60 of a plurality of such chips 61 are mounted along a fluid channel 63 which is a groove measuring approximately 1 mm wide and 1 mm deep formed in a chip-carrying substrate 64 made of silicon carbide (SiC), for example. The chip-carrying substrate 64 having the fluid channel 63 corresponds to the aforementioned container 1. As shown in FIG. 28A, the chips 61 are provided at locations A and B where bypass holes are formed depending on the flow direction of the liquid 5 through the fluid channel 63.

Liquid reservoirs 67a, 67b measuring 1 mm deep are provided at both ends of the fluid channel 63. The chip-carrying substrate 64 is soldered to the top of a board 65 made of copper-tungsten (CuW), for instance. There is formed a cooling water channel 66 inside the board 65 and this cooling water channel 66 corresponds to the aforementioned thermal-radiator-type heat exchanger 3.

Cooling water is fed from an external water pump (not shown) into the cooling water channel 66. The chip-carrying substrate 64 is provided with a cover 64a made of a ceramic or other dielectric sheet. Driving heat exchangers 68a, 68b formed of stainless steel foil, tungsten foil or Nichrome (nickel-chromium) foil, for instance, are joined to the liquid reservoirs 67a, 67b, respectively. There is provided a controller 69 on the board 65 for controllably turning on and off the driving heat exchangers 68a, 68b. Connected to the liquid reservoirs 67a, 67b and the driving heat exchangers 68a, 68b by lines 70, the controller 69 measures the temperatures of the individual liquid reservoirs 67a, 67b and, based on temperature measurement values obtained, outputs electrical signals to the individual driving heat exchangers 68a, 68b for controlling their ON/OFF statuses.

In the heat transport device of the seventeenth embodiment thus constructed, the individual driving heat exchangers 68a, 68b are turned on and off by the controller 69 according to the temperatures of the liquid reservoirs 67a, 67b. As a result, oscillating liquid flows are produced in the fluid channel 63, whereby heat is transferred from the microchannel block 60 at the lower part of the heat-generating element 62 of each chip 61 to the liquid 5 in a manner similar to the foregoing embodiments.

Unlike the foregoing embodiments, the seventeenth embodiment shown in FIGS. 28A–28B has the cooling water channel 66 inside the board 65 which is joined to the bottom of the chip-carrying substrate 64 as a thermal-radiator-type heat exchanger. Thus, heat generated by the heat-generating element 62 in each chip 61 is transferred from the microchannel block 60 to the liquid 5 in the fluid channel 63 and to the cooling water channel 66 in the board 65, and finally conveyed to the exterior of the semiconductor apparatus.

If the water in the cooling water channel 66 were directly passed through the microchannel block 60, foreign matter in the cooling water channel 66 might clog in the microchannel block 60 as its grooves are only 100 μm wide. The heat transport device of this embodiment is protected against such a clogging problem, however, because the liquid 5 flowing through the microchannel block 60 is sealed in the fluid channel 63 which is kept clean and free of any foreign matter.

It might be possible to employ a conventionally known mechanical micropump using vibration of a diaphragm which can be incorporated in a chip-carrying substrate in applications like the aforementioned semiconductor apparatus. The semiconductor apparatus of the seventeenth embodiment employs the heat transport device which performs heat exchange by oscillation of the liquid 5 produced by other than a mechanical pump. A remarkable advantage of the embodiment is that heat can be transported with high reliability without the use of any mechanical driver.

Eighteenth Embodiment

Figure 30:
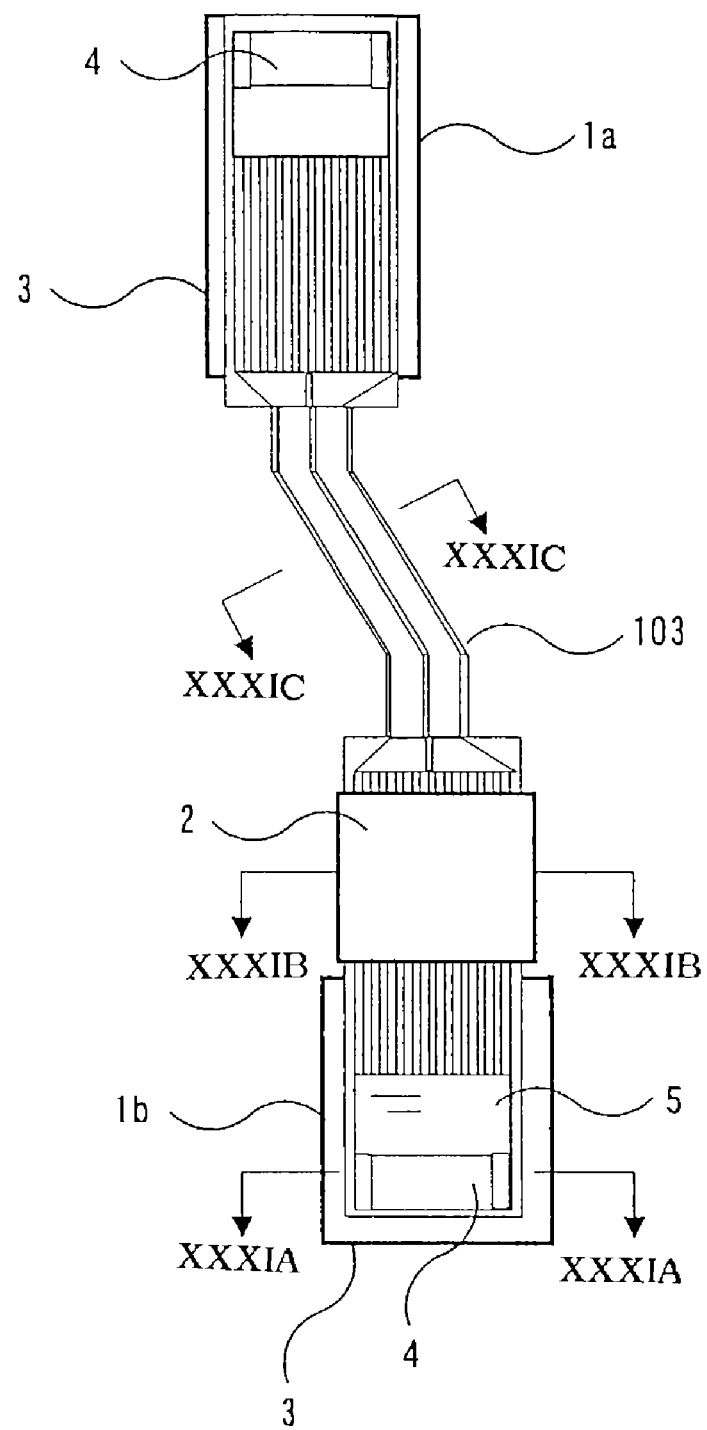
FIG. 30 is a sectional diagram showing the construction of a heat transport device according to an eighteenth embodiment of the invention.
Figure 31A:
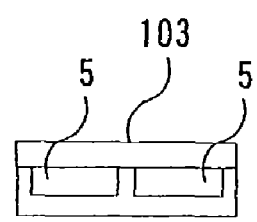
FIGS. 31A–31C are enlarged fragmentary sectional views of the heat transport device of FIG. 30.
Figure 31B:
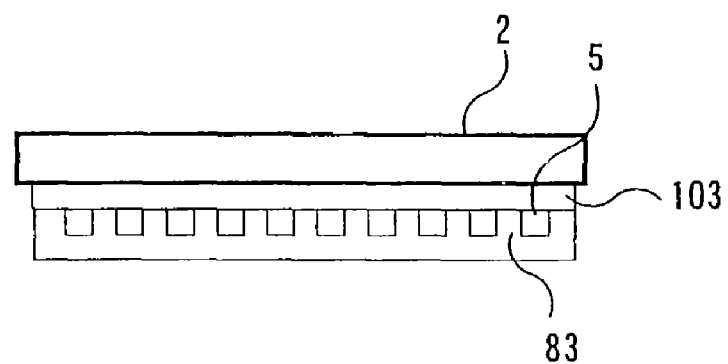
Figure 31C:
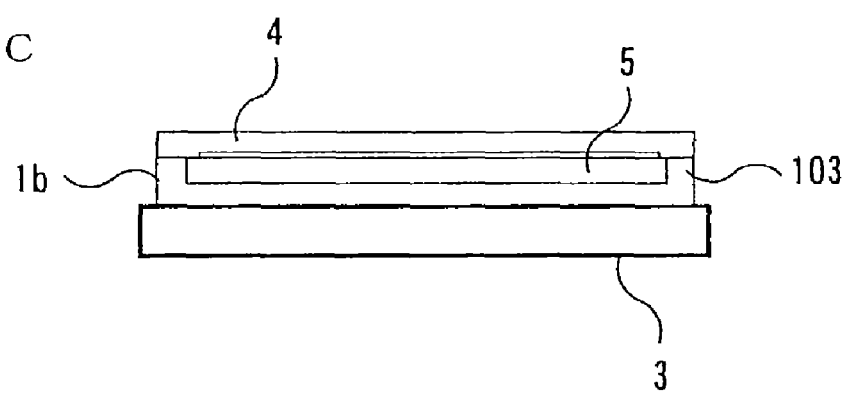

FIG. 30 is a sectional diagram showing the construction of a heat transport device according to an eighteenth embodiment of the invention, and FIGS. 31A–31C are enlarged fragmentary sectional views of the heat transport device of FIG. 30 taken along lines XXXIA—XXXIA, XXXIB—XXXIB, AND XXXIC—XXXIC of FIG. 30. Referring to FIG. 30, a container 103 is produced by molding a resin, for example. Liquid reservoirs 1a, 1b provided at both ends of the container 103 are also resin-molded parts. As shown in FIG. 31B, a portion of the container 103 located beneath a thermal-receiver-type heat exchanger 2 forms a microfin structure 83, of which individual fins measure 1 mm or less in both width and depth, to improve the performance of heat transfer between the wall of the container 103 and the liquid 5.

A portion of the container 103 at the middle of its length has two parallel fluid channels formed in a flexible tube as shown in FIG. 31A. The container 103 is bendable at this flexible tube portion.

The heat transport device of the eighteenth embodiment thus constructed operates in a manner similar to the foregoing embodiments, so that its operation is not discussed in detail here. Since the container 103 of this embodiment is formed into a parallel channel tube at the middle of its length, the container 103 has a large flow passage area. This confers an advantage that liquid flow resistance is reduced and the amount of heat transported from the thermal-receiver-type heat exchanger 2 to a thermal-radiator-type heat exchanger 3 is increased.

A further advantage of the eighteenth embodiment is that it makes it possible to incorporate a heat transport device in a mobile telephone, for instance, which can be folded by a hinge joining its main body and lid. As an example, the liquid reservoir 1a and the liquid reservoir 1b of the heat transport device can be conveniently built in the main body and lid of the mobile telephone, respectively, with the flexible tube portion positioned at the hinge. The heat transport device of the embodiment can also be used in other electronic appliances having a hinge.

Nineteenth Embodiment

Figure 32:
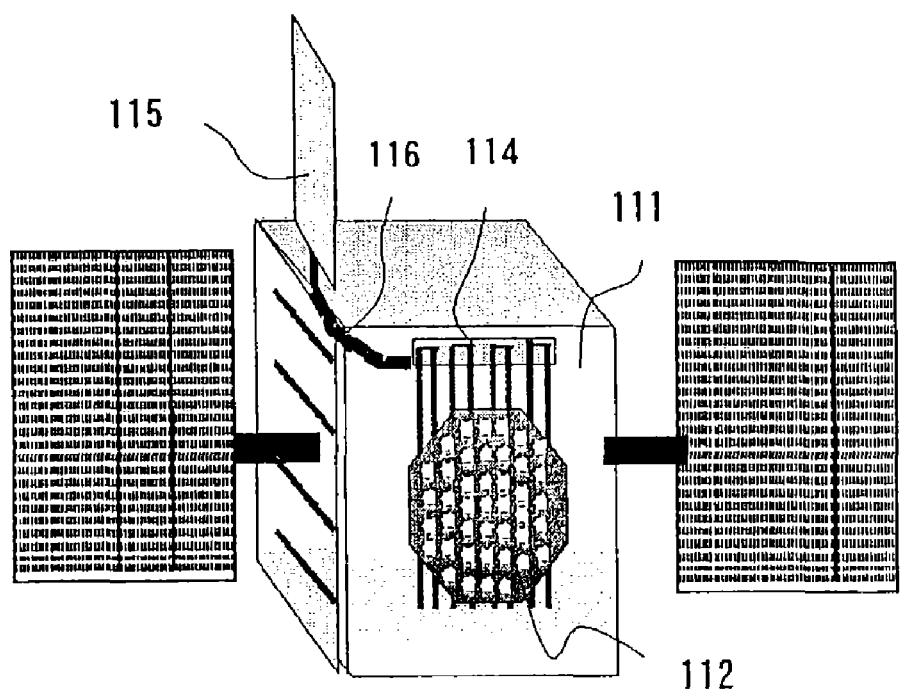
FIG. 32 is a perspective diagram showing the construction of an artificial satellite equipped with a phased array antenna incorporating a heat transport device according to a nineteenth embodiment of the invention.
Figure 33A:
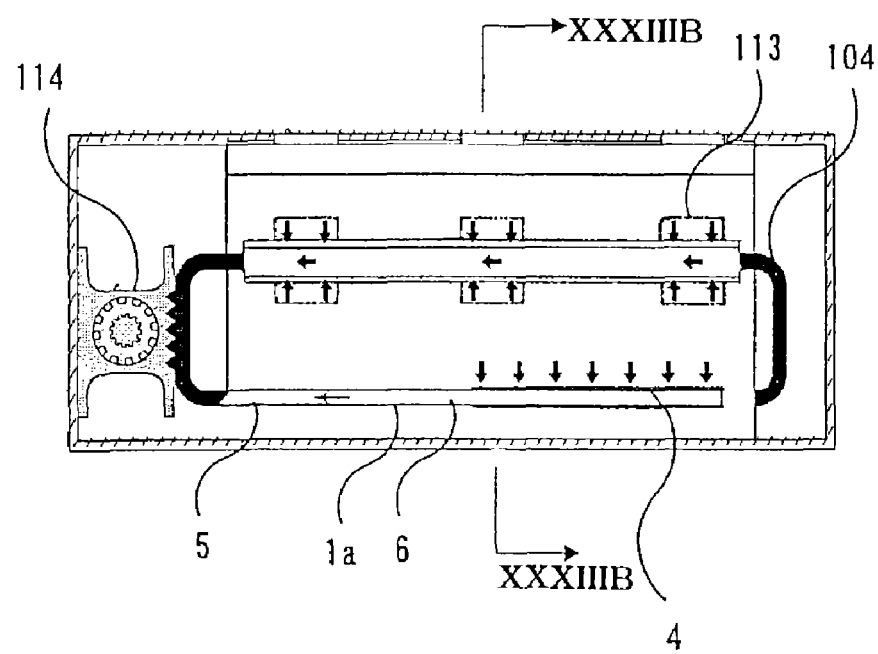
FIGS. 33A–33B are sectional diagrams showing the internal construction of the phased array antenna of FIG. 32.
Figure 33B:
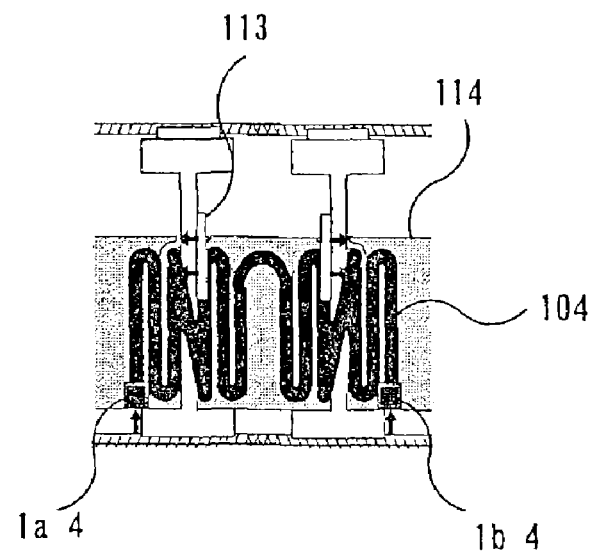

FIG. 32 is a perspective diagram showing the construction of an artificial satellite 111 equipped with a phased array antenna 112 incorporating a heat transport device according to a nineteenth embodiment of the invention for cooling semiconductor devices 113, and FIGS. 33A–33B are sectional diagrams, FIG. 33B being taken along line XXXIIIB—XXXIIIB of FIG. 33A, showing the internal construction of the phased array antenna 112 of FIG. 32. Shown in these Figures is an example in which the heat transport device is applied to the artificial satellite 111, which is an extra-atmospheric mobile unit. The phased array antenna 112 is mounted on a surface of the artificial satellite 111.

As shown in cross sections of FIGS. 33A–33B, the semiconductor devices 113 for transmitting and receiving radio waves are installed inside the phased array antenna 112. A container 104 of the heat transport device measuring 3 mm in external diameter is installed adjacent to the semiconductor devices 113. An evaporator 114 structured in the form of a loop-type heat pipe which serves as a thermal-radiator-type heat exchanger is attached to a middle portion of the container 104. Also, liquid reservoirs 1a, 1b fitted with respective driving heat exchangers 4 are provided at both ends of the container 104.

The evaporator 114 structured as the loop-type heat pipe is connected to a piping 116 which is formed of a liquid pipe and a vapor pipe connected to an expansible radiator 115 as shown in FIG. 32. As the two driving heat exchangers 4 at the liquid reservoirs 1a, 1b are alternately turned on and off, heat generated by the semiconductor devices (heat sources) 113 is transferred to the liquid 5 in the container 104 by oscillating liquid flows produced therein in a manner similar to the foregoing embodiments. In the nineteenth embodiment, heat transferred to the liquid 5 in the container 104 is carried to the loop-type heat pipe evaporator 114, conveyed to the expansible radiator 115 through the piping 116 due to the operation of the loop-type heat pipe (evaporator 114), and eventually dissipated into the outer space.

In a case where the container 104 is as narrow as 3 mm in external diameter as stated above, there is an advantage that it can be used for cooling the semiconductor devices 113 disposed in such a limited space as the interior of the phased array antenna 112. Another advantage of the present embodiment is that the provision of the expansible radiator 115 and the loop-type heat pipe (evaporator 114) which are joined together makes it possible to cool such critical elements as the semiconductor devices 113 even under zero-gravity conditions in the outer space.

When the heat transport device is used in an extra-atmospheric environment, it is preferable that the container 104 be made of aluminum and the liquid 5 sealed in the container 104 be ammonia.

While heat transport devices of the foregoing embodiments are provided with, or not provided with, the liquid reservoirs 1a, 1b (67a, 67b, 100a, 100b), it is possible to determine whether to provide such liquid reservoirs depending on the site of use and required cooling efficiency, for instance. Heating units and cooling units (driving heat exchangers) may also be provided, or not provided, depending on specific requirements.

What is claimed is:

1. A heat transport device comprising:
    a container having opposed first and second ends, a hollow structure including a fluid channel extending between the first and second ends, the first and second ends of the fluid channel being closed to prevent intrusion of external air, and a liquid and a gas sealed in the fluid channel;
    driving heat exchangers located at respective terminal portions of the container for causing the liquid to oscillate along the fluid channel by boiling the liquid;
    at least one thermal-receiver heat exchanger receiving heat from an external heat source and located outside of and on an outer wall of the container at a first position along the fluid channel, between the driving heat exchangers; and
    at least one thermal-radiator heat exchanger radiating heat from the container and located outside of and on the outer wall of the container at a second position along the fluid channel, between the driving heat exchangers, the first and second positions being spaced from each other and serially arranged along the fluid channel.

2. The heat transport device according to claim 1, wherein at least one of the terminal portions of the container where one of the driving heat exchangers is located has, in cross-section, an internal corner.

3. The heat transport device according to claim 1, wherein the terminal portions of the container have a larger cross-sectional area than other portions of the container.

4. The heat transport device according to claim 1, wherein each of the driving heat exchangers includes a heating unit and a cooling unit.

5. The heat transport device according to claim 1, wherein each terminal portion of the container where one of the driving heat exchangers is located has an internal volume at least equal to internal volume of a portion of the container bounded by a center of the thermal-receiver heat exchanger and a center of the thermal-radiator heat exchanger.

6. The heat transport device according to claim 1, wherein the liquid is a combination of immiscible liquids having different boiling points, the liquid with a lower boiling point is sealed in one of the terminal portions of the container, and the liquid with the higher boiling point is sealed in a portion of the container between the terminal portions containing the lower boiling point liquid.

7. The heat transport device according to claim 1, wherein each terminal portion of the container where one of the driving heat exchangers is located has a double pipe structure.

8. The heat transport device according to claim 1, including a pore producing capillary action located inside at least one of the terminal portions of the container where the driving heat exchangers are located.

9. The heat transport device according to claim 1, including a recess as a nucleus for bubble formation located in at least one of the terminal portions of the container where the driving heat exchangers are located.

10. The heat transport device according to claim 1, wherein the fluid channel is a meandering fluid channel.

11. The heat transport device according to claim 10, including a single wall separating adjacent portions of the meandering fluid channel.

12. The heat transport device according to claim 11, including a bypass hole, which allows the liquid to pass, in the single wall between the adjacent portions of the meandering fluid channel.

13. The heat transport device according to claim 12, wherein at least one of the thermal-receiver heat exchanger and the thermal-radiator heat exchanger is located on a portion of an outer wall of the container where the bypass hole is located.

14. The heat transport device according to claim 10, wherein the driving heat exchangers include a Peltier element, and the terminal portions of the container are joined to each other via the Peltier element.

15. The heat transport device according to claim 1, wherein the container has a portion including a flexible material.

16. The heat transport device according to claim 1, wherein the liquid is caused to oscillate in directions along the fluid channel by heating and cooling by the driving heat exchangers, the heat transport device further comprising a controller for controllably switching the driving heat exchangers between heating and cooling cycles, based on temperatures of the driving heat exchangers detected by the controller.

17. The heat transport device according to claim 1 comprising multiple containers located adjacent to each other, wherein the driving heat exchangers are switched between heating and cooling cycles with different timings.

18. A semiconductor apparatus comprising:
    a semiconductor device having a heat-generating portion; and
    a heat transport device comprising:
        a container having opposed first and second ends, a hollow structure including a fluid channel extending between the first and second ends, the first and second ends of the fluid channel being closed to prevent intrusion of external air, and a liquid and a gas sealed in the fluid channel;
        driving heat exchangers located at respective terminal portions of the container for causing the liquid to oscillate along the fluid channel by boiling the liquid;
        at least one thermal-receiver heat exchanger receiving heat from an external heat source and located outside of and on an outer wall of the container at a first position along the fluid channel, between and spaced from the driving heat exchangers; and
        at least one thermal-radiator heat exchanger radiating heat from the container and located outside of and on the outer wall of the container at a second position along the fluid channel, between the driving heat exchangers, the first and second positions being spaced from each other and serially arranged along the fluid channel, wherein the thermal-receiver heat exchanger is located immediately adjacent to the heat-generating portion which generates heat when said semiconductor device is in operation.

19. An extra-atmospheric mobile unit comprising:
a heat-generating portion; and
a heat transport device comprising:
- a container having opposed first and second ends, a hollow structure including a fluid channel extending between the first and second ends, the first and second ends of the fluid channel being closed to prevent intrusion of external air, and a liquid and a gas sealed in the fluid channel;
- driving heat exchangers located at respective terminal portions of the container for causing the liquid to oscillate along the fluid channel by boiling the liquid;
- at least one thermal-receiver heat exchanger receiving heat from an external heat source and located outside of and on an outer wall of the container at a first position along the fluid channel, between the driving heat exchangers; and
- at least one thermal-radiator heat exchanger radiating heat from the container and located outside of and on the outer wall of the container at a second position along the fluid channel, between the driving heat exchangers, the first and second positions being spaced from each other and serially arranged along the fluid channel, wherein the thermal-receiver heat exchanger is located immediately adjacent to the heat-generating portion which generates heat when the extra-atmospheric mobile unit is in operation.

* * * * *